United States Patent
Otey et al.

(10) Patent No.: US 10,054,341 B2
(45) Date of Patent: Aug. 21, 2018

(54) INTEGRATED THERMOELECTRIC-POWERED FLUID HEAT EXCHANGER

(71) Applicant: Ferrotec (USA) Corporation, Santa Clara, CA (US)

(72) Inventors: Robert Otey, Trinity Center, CA (US); David A. Kaminski, Dunbarton, NH (US); Pheng Sin, Livermore, CA (US)

(73) Assignee: Ferrotec (USA) Corporation, Santa Clara, CA (US)

( * ) Notice: Subject to any disclaimer, the term of this patent is extended or adjusted under 35 U.S.C. 154(b) by 832 days.

(21) Appl. No.: 14/487,222

(22) Filed: Sep. 16, 2014

(65) Prior Publication Data
US 2015/0300705 A1    Oct. 22, 2015

Related U.S. Application Data

(63) Continuation-in-part of application No. 14/256,926, filed on Apr. 19, 2014.

(51) Int. Cl.
*F25B 21/02* (2006.01)
*H01L 35/30* (2006.01)
(Continued)

(52) U.S. Cl.
CPC .............. *F25B 21/02* (2013.01); *F28D 1/024* (2013.01); *H01L 35/30* (2013.01); *F28F 5/00* (2013.01)

(58) Field of Classification Search
CPC .................... F28F 5/00; H01L 35/30
See application file for complete search history.

(56) References Cited

U.S. PATENT DOCUMENTS 4,483,341 A * 11/1984 Witteles ............... A61F 7/00
606/21
4,726,193 A    2/1988 Burke et al.
(Continued)

FOREIGN PATENT DOCUMENTS

| EP | 1429089 A2 | 6/2004 |
| JP | 07-104113 B2 | 11/1995 |
| WO | 2012-061777 A2 | 5/2012 |

OTHER PUBLICATIONS

Juetter, IEEE Transactions on Biomedical Engineering, 1982, vol. BME-29, No. 5, pp. 314-321.*
(Continued)

*Primary Examiner* — Sadie White
(74) *Attorney, Agent, or Firm* — Robert R. Deleault, Esq.; Mesmer & Deleault, PLLC

(57) ABSTRACT

A fluid heat exchanger has an impeller assembly with first and second impeller bodies mated together, each having a substantially circular shape and at least one opening therethrough. Impeller vanes extend axially from the first impeller body and away from the second impeller body. Impeller vanes extend axially from the second impeller body away from the first impeller body. A thermoelectric module is disposed between the first impeller body and the second impeller body. Heat sinks are connected to each side of the thermoelectric module and extend through at least one opening in the first and second impeller bodies, where the impeller vanes are configured to move a fluid through the heat sinks during rotation of the first and second impeller bodies. Electrically-conductive windings disposed in the impeller assembly are configured to deliver induced electric current to the thermoelectric module(s).

9 Claims, 15 Drawing Sheets

(51) Int. Cl.
*F28D 1/02* (2006.01)
*F28F 5/00* (2006.01)

(56) References Cited

U.S. PATENT DOCUMENTS

| | | | |
|---|---|---|---|
| 5,315,830 A * | 5/1994 | Doke | ............... F25B 21/02 |
| | | | 62/3.2 |
| 5,822,993 A | 10/1998 | Attey | |
| 2002/0134087 A1 | 9/2002 | Urch | |
| 2003/0024565 A1 | 2/2003 | Guy | |
| 2009/0026813 A1 | 1/2009 | Lofy | |
| 2009/0034202 A1 | 2/2009 | Chiu et al. | |

OTHER PUBLICATIONS

PCT International Search Report and Written Opinion, PCT/US2014/056353, dated Jun. 12, 2015.
European search report in counterpart application EP 14 90 2266, dated May 7, 2018.

* cited by examiner

Fig. 16
Fig. 16A
Fig. 17
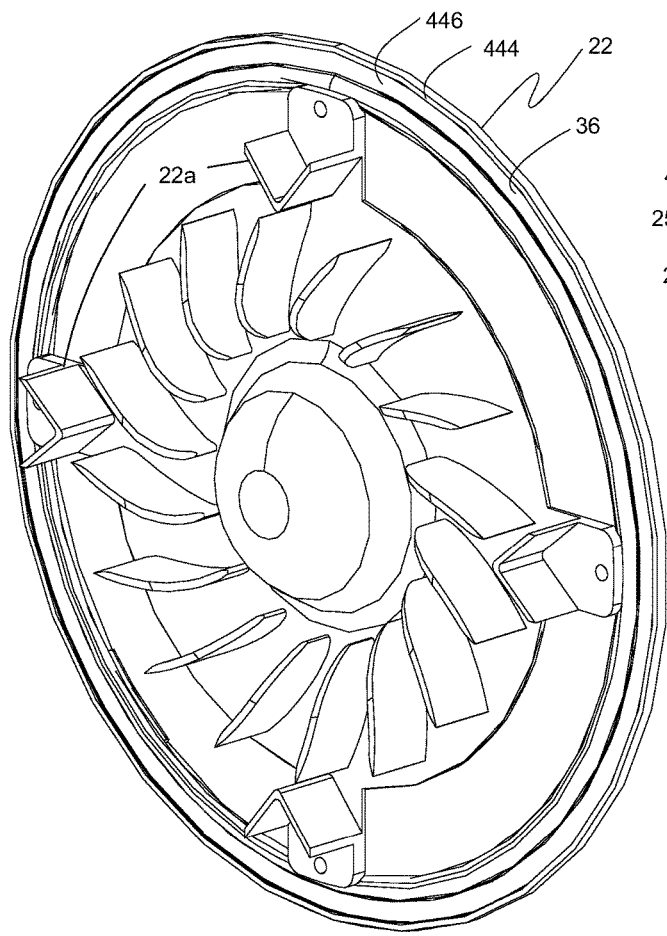
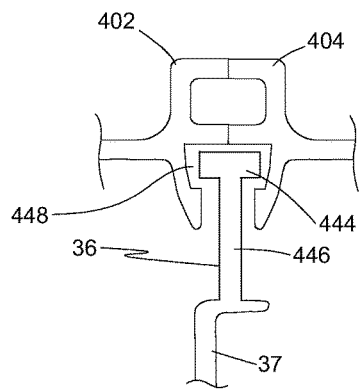
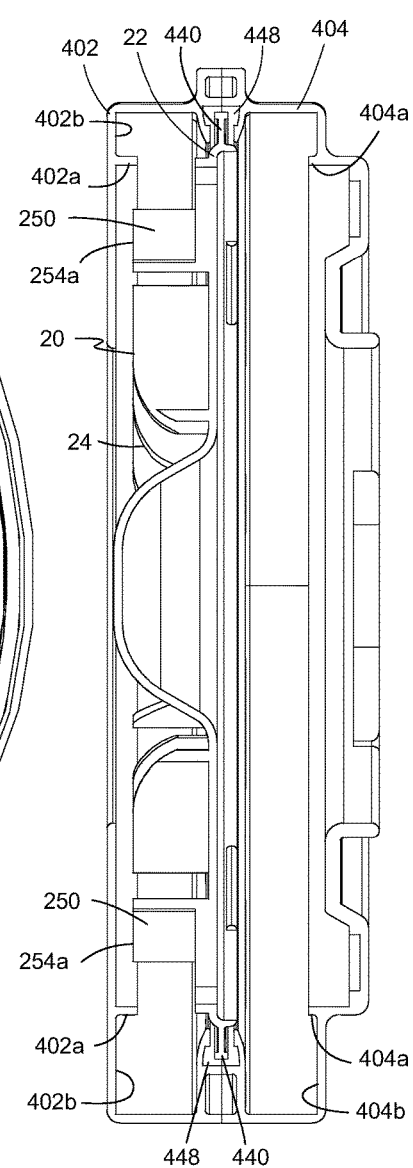

INTEGRATED THERMOELECTRIC-POWERED FLUID HEAT EXCHANGER

This application is a Continuation-In-Part application of U.S. Ser. No. 14/256,926, filed on Apr. 19, 2014, which application claims the benefit of U.S. Provisional Patent Application No. 61/813,669, Apr. 19, 2013.

BACKGROUND OF THE INVENTION

1. Field of the Invention

The present invention relates generally to thermoelectric devices and more particularly to an integrated thermoelectric-powered fluid heat exchanger.

2. Description of the Prior Art

A thermoelectric (TE) module, also called a thermoelectric cooler or Peltier cooler, is a semiconductor-based electronic component that functions as a heat pump. By applying low-voltage DC power to a TE module, heat is transferred through the module from one side to the other. One module face, therefore, is cooled while the opposite face is simultaneously heated. This phenomenon may be reversed by changing the polarity of the applied DC voltage. As a result, heat is transferred in the opposite direction. Consequently, a thermoelectric module may be used for both heating and cooling, making it suitable to precisely control temperature.

In practice, a thermoelectric module generally consists of two or more elements of n-type and p-type doped semiconductor material (e.g., bismuth telluride) that are connected electrically in series and connected thermally in parallel. These thermoelectric elements and their electrical interconnects typically are mounted between two ceramic substrates. The substrates hold the overall structure together mechanically and electrically insulate the individual elements from one another and from external mounting surfaces. Thermoelectric modules have a size of up to 300×300 mm (12×12 inches) and a height or thickness of 0.5 to 5 mm (0.02 to 0.2 inches). A variety of different shapes, substrate materials, metallization patterns and mounting options are available.

Thermoelectric modules are typically used in fluid heat exchangers as a stationary device where heat sinks or separate thermal transport devices are situated with the thermoelectric module. A blower, fan, pump, or the like provides a fluid supply stream used in transferring heat between the heat sinks and the fluids.

In a typical configuration, power is supplied to a thermoelectric module from a separate power source. In rotating devices where hard wiring is not possible due to rotation, power is commonly supplied through commutators or slip rings in contact with rotating conductors. Rotating conductors (either slip rings or commutator segments) are added to the rotating shaft and include stationary carbon brushes to transfer the power. In other variations, the brushes rotate in contact with stationary conductors.

SUMMARY OF THE INVENTION

The above-described configurations have problems and deficiencies upon which the present invention improves. A typical configuration with a thermoelectric module includes many parts, is constrained by size, and is limited by the availability of fluid supplies.

In traditional rotating devices, where power is supplied to the rotating device by commutators or slip rings, the rotation speed is limited due to heat from friction. Also, rotation causes wear to contacts and requires maintenance, such as checking for wear and or replacing brushes. Cleanliness and contamination is also a problem due to particles generated by friction between moving parts.

Therefore, what is needed is a fluid heat exchanger that reduces or eliminates moving electrical connectors and reduces contamination to the surroundings.

It is an object of the present invention to integrate a thermoelectric heat exchanger and fluid mover in a single assembly.

It is another object of the present invention to improve the reliability of fluid heat exchangers.

It is another object of the present invention to deliver induced electric power to a thermoelectric module.

The present invention achieves these and other objectives by providing a single assembly that integrates a thermoelectric module, heat sinks, and a fluid mover or impeller. In one embodiment of the present invention, an integrated fluid heat exchanger includes an impeller assembly with a first impeller body and a second impeller body. Each impeller body has a substantially circular shape and having at least one opening therethrough. The second impeller body is disposed substantially parallel to and connected to the first impeller body, the second impeller body having a substantially circular shape and with the opening(s) therethrough coinciding with the opening(s) through the first impeller body. A plurality of first impeller vanes extends axially from the first impeller body and away from the second impeller body. A plurality of second impeller vanes extends axially from the second impeller body and away from the first impeller body. At least one thermoelectric module is disposed between the first impeller body and the second impeller body, where each thermoelectric module has a first substrate and a second substrate. A first heat sink is connected to the first substrate and extends through the first opening(s) through the first impeller body and a second heat sink is connected to the second substrate and extends through the opening(s) in the second impeller body.

In another embodiment, the integrated fluid heat exchanger includes a housing having a first housing member, a second housing member connectable to the first housing member and defining a first housing input opening, a second housing input opening, a first housing outlet portion and a second housing outlet portion. The fluid heat exchanger also includes an induced power assembly that includes an electrically-conductive transmitter coil fixedly disposed in the second housing member and adapted to be connected to an AC power source, a receiver coil having a plurality of electrically-conductive windings fixedly attached to the impeller assembly. The receiver coil is substantially aligned with and separated from the transmitter coil by an air gap and adapted to deliver an induced current to the thermoelectric module(s).

In another embodiment, the integrated fluid heat exchanger also includes a rectifier circuit electrically coupled between the receiver coil and the thermoelectric module(s), where the rectifier circuit is adapted to provide DC current to the thermoelectric module(s) based on the induced current delivered from the receiver coil.

In another embodiment, the integrated fluid heat exchanger each thermoelectric module is positioned annularly between the outermost perimeter of the first and second impeller bodies and the impeller vanes.

In another embodiment, the integrated fluid heat exchanger includes an oscillator circuit electrically coupled to the transmitter coil and is adapted to deliver high-frequency AC power to the transmitter coil. In another embodiment, the integrated fluid heat exchanger has a tuning capacitor electrically coupled to the receiver coil and connected in parallel with the rectifier circuit.

In another embodiment, the integrated fluid heat exchanger includes a filter capacitor electrically coupled to the rectifier circuit and connected in parallel with the thermoelectric module(s).

In another embodiment, the rectifier circuit includes a plurality of diodes disposed circumferentially around the impeller assembly.

In another aspect of the present invention, a method of fluid heat exchange includes providing a fluid heat exchanger comprising an impeller assembly that includes a first impeller body with a substantially circular shape and having at least a first opening therethrough; a second impeller body disposed substantially parallel to and connected to the first impeller body, where the second impeller body has a substantially circular shape and at least a second opening therethrough that coincides with the at least first opening of the first impeller body; a plurality of impeller vanes extending axially from the first impeller body and away from the second impeller body; a plurality of second impeller vanes extending axially from the second impeller body and away from the first impeller body; at least one thermoelectric module disposed between the first impeller body and the second impeller body, the at least one thermoelectric module having a first substrate and a second substrate; a first heat sink connected to the first substrate and extending through the at least first opening; a second heat sink connected to the second substrate and extending through the at least second opening; a housing having a first housing input opening, a second housing input opening, a first housing outlet portion and a second housing outlet portion, where the impeller assembly is rotatably disposed within the housing; a transmitter coil disposed in the housing; and a receiver coil disposed on the impeller assembly and spaced apart from and aligned with the transmitter coil. The method also includes the step of rotating the impeller assembly about a central impeller axis, thereby drawing a fluid into each of the first housing input opening and the second housing input opening and dispensing fluid through each of the first housing outlet portion and the second housing outlet portion, respectively. The method also includes the steps of delivering high-frequency AC power to the transmitter coil to induce AC current in the receiver coil, converting the induced AC current to DC power, and delivering the DC power to the thermoelectric module(s). In one embodiment of the method, the fluid is a gas, such as air.

In another embodiment of the method, the step of converting the induced current to DC power includes selecting a rectifier circuit having a filter capacitor electrically coupled to a bridge rectifier and in parallel with the thermoelectric module(s).

In another embodiment of the method, the step of delivering high-frequency AC power to the transmitter coil is performed using an oscillator circuit electrically coupled to the transmitter coil.

In another embodiment of the method, the oscillator circuit is a Royer oscillator or a Collpits oscillator or other suitable triggering or control circuits.

In another embodiment of the method, the step of providing the impeller assembly includes selecting an impeller assembly having impeller blades with an airfoil design and selecting a heat sink where the heat sink has a plurality of heat sink fins with a forward-curved design or a plurality of heat sink fins with a radially curved design.

In another embodiment of the method, the step of providing a fluid heat exchanger includes selecting the fluid heat exchanger with the transmitter coil spaced apart from the receiver coil a distance on the order of millimeters.

In another embodiment of the method, the step of providing a fluid heat exchanger includes selecting a receiver coil disposed proximate a perimeter rim of the impeller assembly.

In another embodiment of the method, the step of providing a fluid heat exchanger includes selecting the impeller assembly having a plurality of diodes substantially distributed circumferentially about the impeller assembly, wherein the plurality of diodes comprise a bridge rectifier.

BRIEF DESCRIPTION OF THE DRAWINGS

FIG. 16 is a perspective view of one embodiment of a first impeller body including a T-shaped divider panel.

FIG. 16A is a cross-sectional schematic showing a divider ring and corresponding divider ring opening of one embodiment of an impeller assembly of the present invention.

FIG. 17 is a cross-sectional view of a fluid head exchanger of the present invention showing a housing and impeller assembly with divider ring.

DETAILED DESCRIPTION OF THE PREFERRED EMBODIMENT

Figure 1:
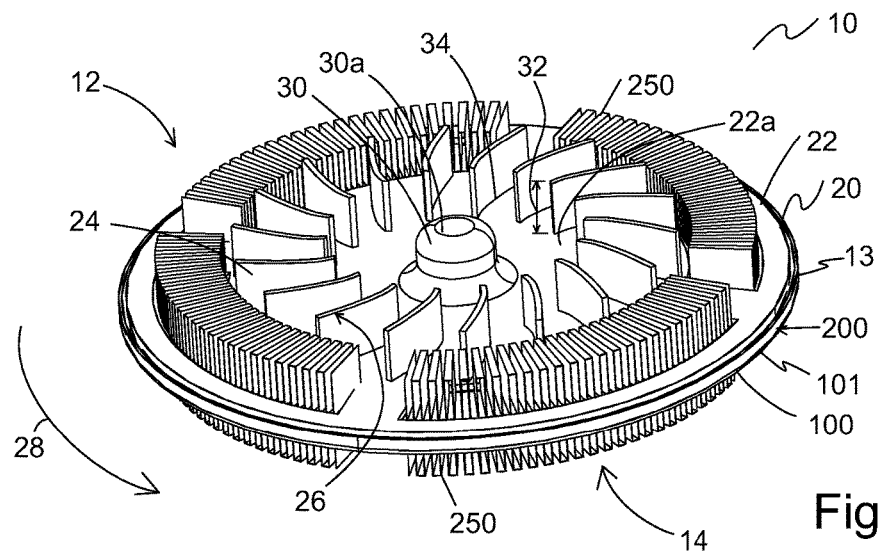
FIG. 1 is a perspective view of one embodiment of a fluid heat exchanger of the present invention showing a first side.

The preferred embodiments of the present invention are illustrated in FIGS. 1-20. FIG. 1 illustrates a perspective view of one embodiment of a fluid heat exchanger 10 of the present invention. Fluid heat exchanger 10 includes a fluid mover assembly or impeller assembly 20 and a thermoelectric module 200 (shown in FIG. 6) with a plurality of heat sinks 250. This embodiment integrates thermoelectric module 200, impeller assembly 20, and heat sinks 250 as a single assembled unit that is configured to rotate on a shaft (not shown) that extends into or through an aperture 30a in hub 30. Each heat sink 250 has a plurality of heat sink fins 251.

Impeller assembly 20 includes a first-side impeller assembly 13 and a second-side impeller assembly 101. One or more thermoelectric module(s) 200 is (are) sandwiched between a first impeller body 22 and a second impeller body 100. A plurality of heat sinks 250 are attached to or formed integrally with each thermoelectric module 200, preferably with at least one heat sink 250 on a first side 202 and on a second side 204 of thermoelectric module 200 (shown in FIG. 6 and discussed below).

First impeller body 22 has a plurality of first impeller vanes 24 attached to or extending from first impeller body 22 in a substantially perpendicular direction to first impeller body surface 22a. First impeller vanes 24 are annularly spaced a predefined distance from hub 30. In one embodiment, first impeller body 22 has eighteen first impeller vanes 24. In another embodiment first impeller body 22 has sixteen first impeller vanes 24. Other quantities may be selected as appropriate for the desired fluid flow and heat transfer effect. In one embodiment, each impeller vane 24 has a concave face 26 that preferably faces in the direction of rotation 28 to more efficiently move a fluid, such as air, through or across heat sink(s) 250.

Figure 2:
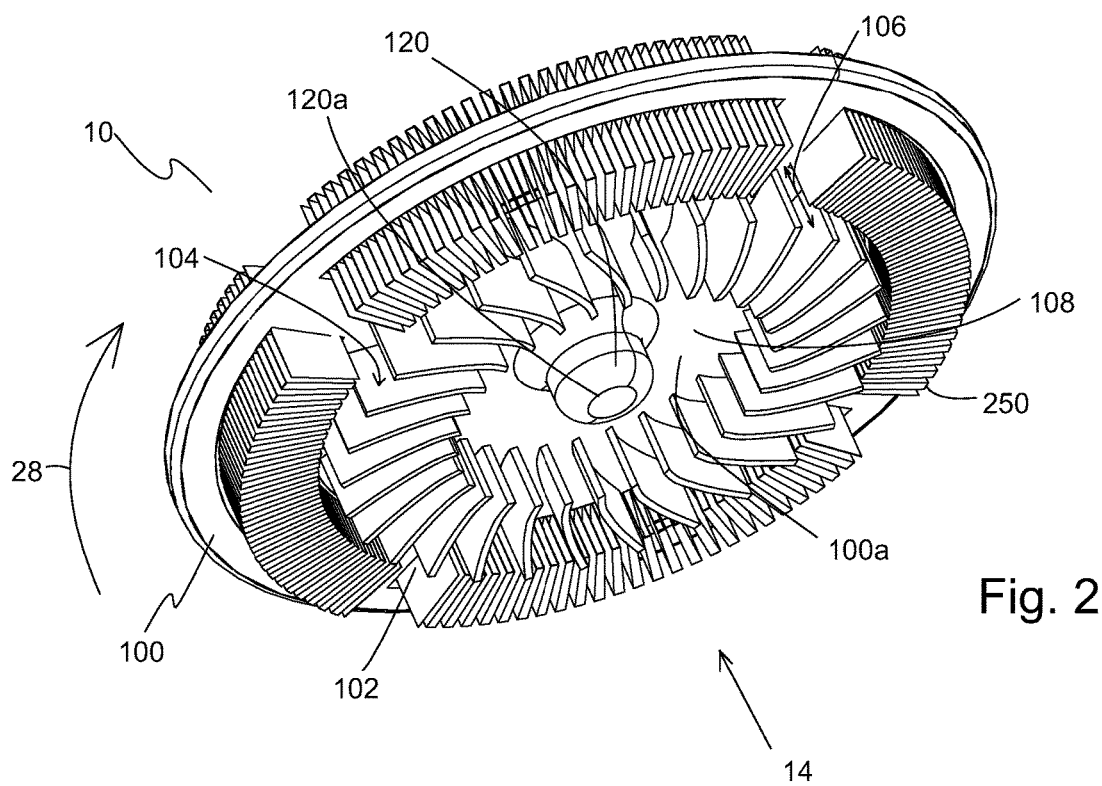
FIG. 2 is a perspective view of the fluid heat exchanger of FIG. 1 showing a second side.

Referring now to FIG. 2, a perspective view illustrates one embodiment of a second side 14 of impeller assembly 20. Similar to first impeller body 22, second impeller body 100 has a plurality of second impeller vanes 102 attached to or extending from second impeller body surface 100a in a substantially perpendicular direction. Second impeller vanes 102 are annularly spaced a predefined distance from hub 30. In this embodiment, second impeller body 100 has thirty second impeller vanes 102. It was found that sixteen second impeller vanes 102 may provide advantages over thirty second impeller vanes 102 such as, for example, reduced weight, more quiet airflow, etc. Other quantities may be selected as appropriate for the desired fluid flow and heat transfer effect. In one embodiment, each impeller vane 102 has a concave face 104 that faces away from the direction of rotation 28 to more efficiently move a fluid, such as air, through or across heat sink(s) 250. In some embodiments, second impeller vanes 102 have height 106 that is the same or lesser than the height of heat sink(s) 250. Advantages of these embodiments are more clearly explained below in the embodiments related to FIG. 12 and following. Second impeller body 100 has a second hub 120 with second aperture 120a to receive a shaft (not shown). In some embodiments, aperture 30a of hub 30 is continuous with second aperture 120a of second hub 120. It is contemplated that first and second impeller bodies 22, 100 may have a different number of impeller vanes 24, 102 on each side or an equal number of vanes and the above-listed number of vanes is not intended to be limiting. In other embodiments, impeller vanes 24, 102 have height 32, 106, respectively, that is the same or lesser than the height of the heat sink(s) 250. It is also understood that the impeller vane may have any shape so long as it transverse to the impeller body and provides air movement across heat sinks 250. It is further understood that the impeller vanes may vary in height. In one embodiment, the plurality of first and second impeller vanes 24, 102 are annularly spaced a second predefined distance from hub 30. In another embodiment, the plurality of first and second impeller vanes 22, 102 extend radially from hub 30. It is also contemplated that first and/or second impeller vanes 24, 102 may be spaced from hub 30 while the other of the first and/or second impeller vanes 22, 102 extend radially from hub 30.

Figure 3:
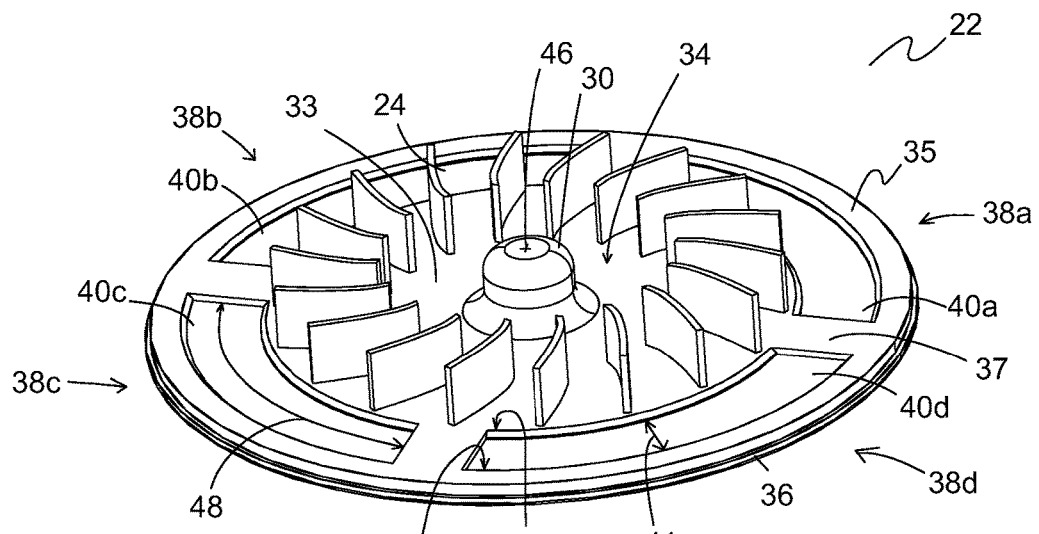
FIG. 3 is a perspective view of a impeller body of the present invention showing an outside surface with impeller vanes.

Referring now to FIG. 3, there is illustrated a top, perspective view of first impeller body 22 with hub 30 and first impeller vanes 24. First impeller body 22 is generally planar with an outside surface 34. First impeller body 22 has an inner region 33 of generally circular shape connected to an outer ring 35 by bridge segments 37 extending radially between inner region 33 and outer ring 35. Outer ring 35 has an overhanging perimeter rim 36 that extends in a direction (e.g., downward) opposite of first impeller vanes 24 (e.g., upward). First impeller body 22 has a plurality of openings 40 extending axially therethrough, preferably arc-shaped, and bounded by inner region 33, bridge segments 37, and outer ring 35. The plurality of openings 40 are also called annular openings, which are positioned a first predefined distance from the center of first impeller body 22. In the illustrated embodiment, first impeller body 22 has a plurality of openings 40 that may be labeled as first, second, third, and fourth annular openings. It is contemplated that bridge segments 37 may be narrower or wider than shown relative to the openings 40, or may be eliminated entirely with modification to the mating of first and second impeller bodies 22, 100.

In one embodiment, first impeller body 22 has four openings 40a-40d with one opening 40 disposed in each of four quadrants 38a-38d of planar surface 34, with even angular spacing between four bridge segments 37. Each of openings 40a-40d preferably extends between a first radius 42 and a second radius 44 from center 46 of outside surface 34 and has an arc width 48 of about eighty degrees. Openings 40a-40d are sized and configured to allow heat sinks 250 to extend therethrough. In other embodiments, more or fewer openings 40 may be used, such as a plurality of substantially square or rectangular openings 40 evenly spaced around first impeller body 22 for receiving substantially square or rectangular thermoelectric modules 200.

Figure 4:
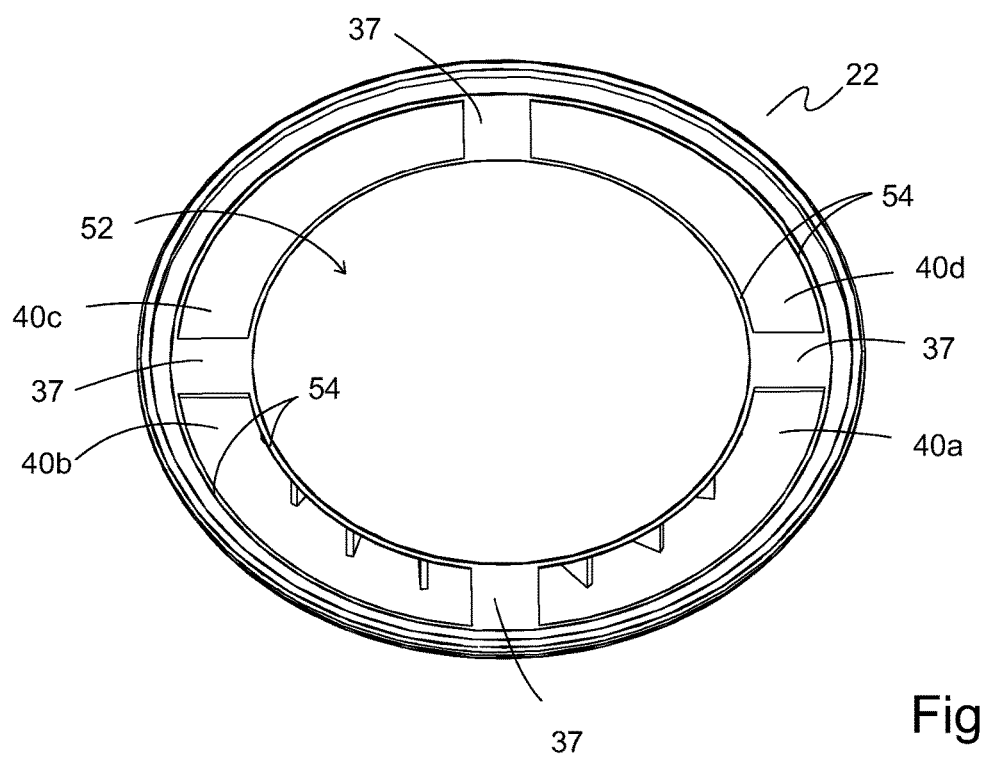
FIG. 4 is a perspective view of the impeller body of FIG. 3 showing an inside surface.

Referring now to FIG. 4, a perspective view is shown of inside surface 52 of first impeller body 22. A ring-shaped first substrate recess 54 is disposed on inside surface 52 and enclosing openings 40a-40d and bridge segments 37. First substrate recess 54 is sized and configured to receive first substrate 202 of thermoelectric module 200, which is discussed below with reference to FIG. 6. Inside surface 52 optionally includes one or more additional features useful for attaching first impeller body 22 to second impeller body 100. These additional features include, for example, a locking ring, fastener openings, fastener posts, standoff posts or members, and structures known in the art for snap-fit engagement between first impeller body 22 and second impeller body 100. These optional features may similarly be included on inside surface 110 of second impeller body 100, which is discussed below. Standoff posts or members may be strategically placed to provide additional strength to the thermoelectric module 200.

Figure 5:
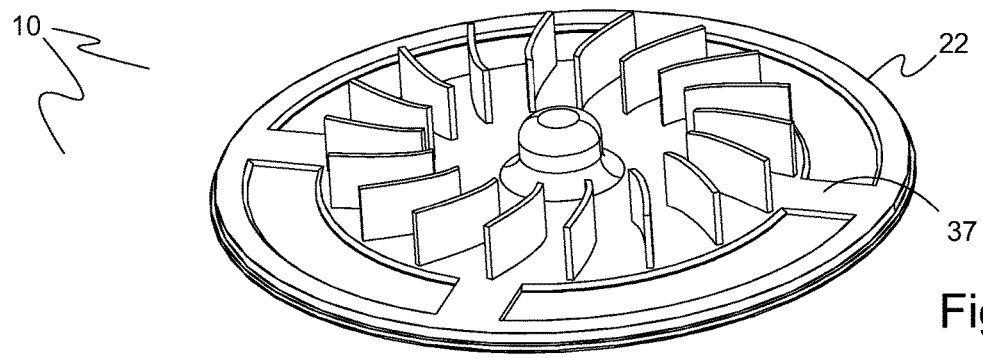
FIG. 5 is a perspective view of the impeller body of FIG. 3 shown as part of an exploded assembly with a thermoelectric module and second impeller body.
Figure 6:
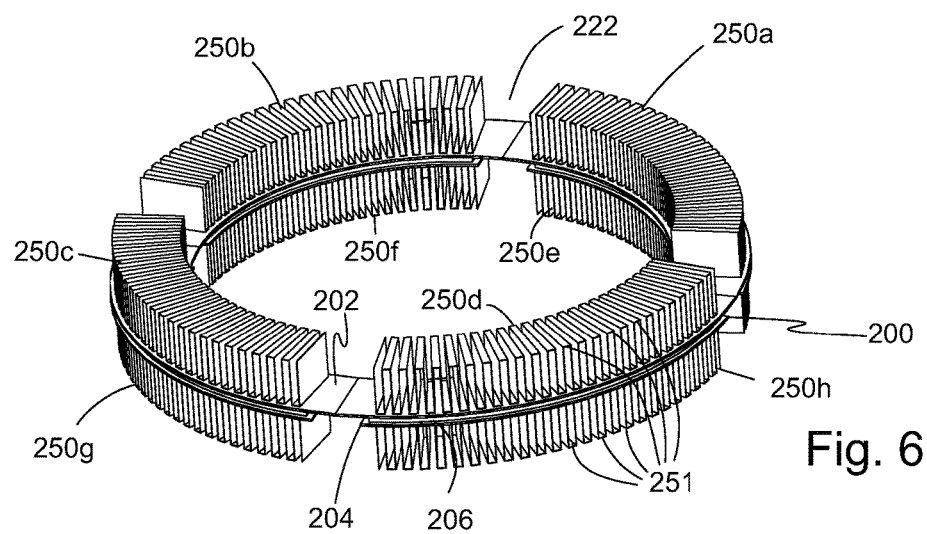
FIG. 6 is a perspective view of a thermoelectric module with heat sinks of the present invention shown as part of an exploded assembly.
Figure 7:
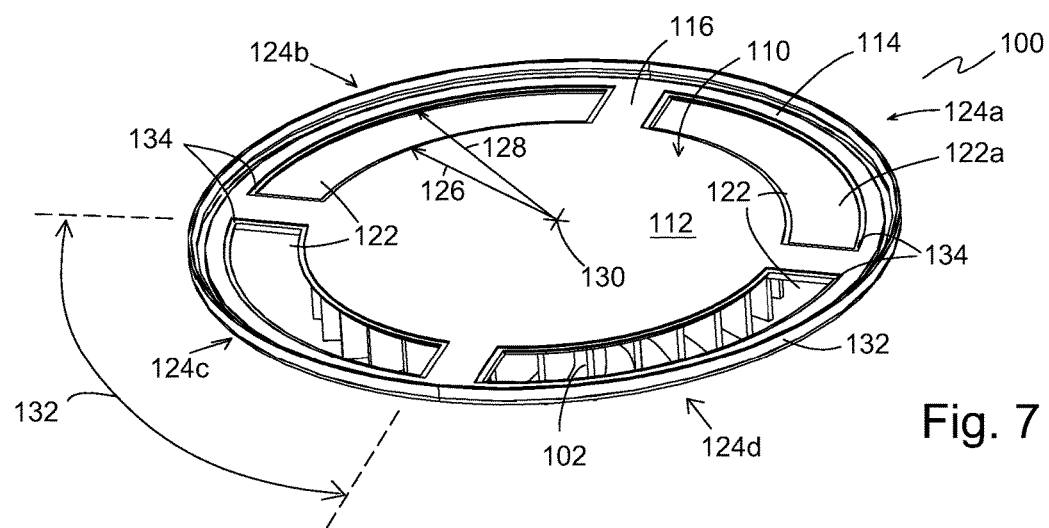
FIG. 7 is a perspective view of a second impeller body of the present invention showing an inside surface and as part of an exploded assembly.

FIGS. 5, 6, and 7 as a group illustrate an exploded, perspective view of components of impeller assembly 20 with first impeller body 22, thermoelectric module 200 with heat sinks 250, and second impeller body 100. First impeller body 22 was discussed above. Heat sinks 250 each have the plurality of heat sink fins 251. In one embodiment, the heat sink fins 251 are spaced a predefined distance from perimeter rim 36 of impeller assembly 20. In another embodiment, the heat sink fins 251 substantially align with perimeter rim 36 of impeller assembly 20.

Referring now to FIG. 6, a perspective view shows one embodiment of thermoelectric module 200 with heat sinks 250. The assembly of four thermoelectric modules 200 forms a substantially annular shape with a semiconductor layer 206 disposed between a first substrate 202 and a second substrate 204 of each thermoelectric module 200. In other words, each thermoelectric module 200 defines an arc. Semiconductor layer 206 comprises a plurality of n-type and p-type semiconducting materials that are electrically connected in series. For example, adjacent n-type and p-type materials are connected with copper connectors and forming a planar array of n-p and p-n junctions. First substrate 202 and second substrate 204 each connect to opposite sides of semiconductor layer 206 to structurally hold together the plurality of n-p and p-n junctions. First substrate 202 and second substrate 204 also transfer heat from semiconductor layer 206 to heat sinks 250. First substrate 202 and second substrate 204 preferably are made of electrically-insulating materials and, preferably thermally conductive materials, such as a ceramic, epoxy, polyimide, etc. As illustrated, there is a space 222 between the heat sinks 250 coinciding with the bridge elements 37. Space 222 may optionally include blocking members (not shown) to block the flow of air through space 222. An advantage of including optional blocking members in space 222 would be to cause all air flow to be conditioned.

Heat sink 250 has four heat sink portions 250a-250d thermally connected to first substrate 202 in a spaced, radial orientation, respectively, and four heat sink portions 250e-250h thermally connected to second substrate 204. Each heat sink portion 250a-250h has a plurality of heat sink fins 251.

Figure 6A:
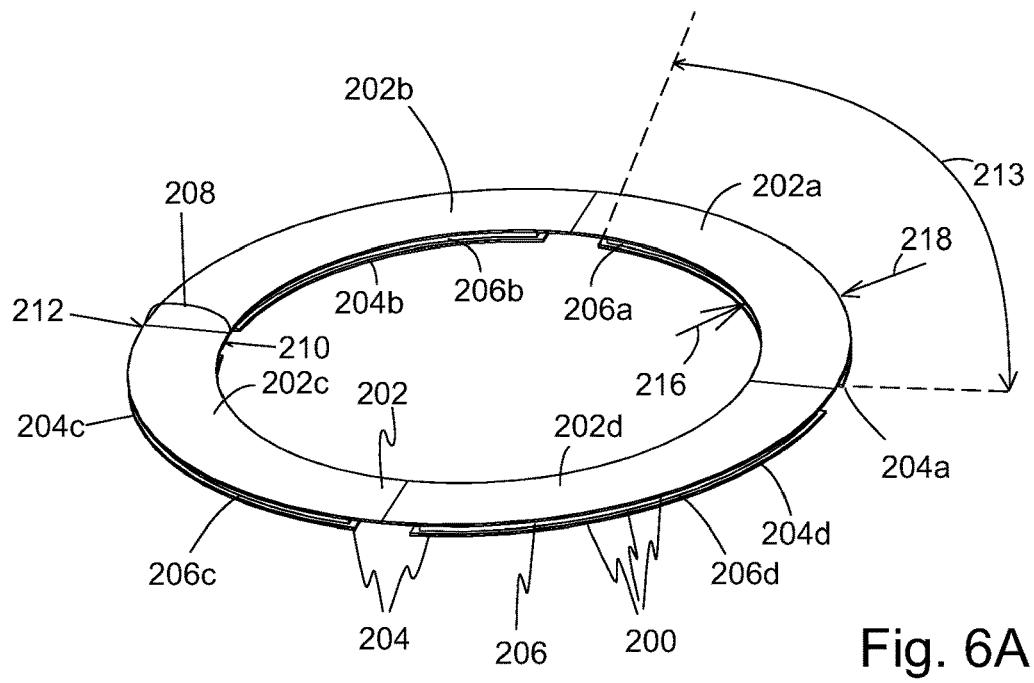
FIG. 6A is a perspective of the thermoelectric module of FIG. 6 without heat sinks.

Turning now to FIG. 6A, there is illustrated thermoelectric module 200 without the heat sinks 250 for clarity. First substrate 202 includes four arc-shaped portions 202a-202d. Second substrate 204 includes four distinct arc-shaped portions 204a-204d that are shorter in length compared to arc-shaped portions 202a-202d in this embodiment to provide space for electrical connections. More or fewer portions may be used in each of first substrate 202 and second substrate 204. Like second substrate 204, semiconductor layer 206 has four distinct regions or portions 206a-206d disposed between substrates 202 and 204 that coincide with arc-shaped portions 202a and 204a, 202b and 204b, 202c and 204c, 202d and 204d, respectively.

In one embodiment, first substrate 202 and second substrate 204 have equal radial widths 208 between a third (inner) radius 210 and a fourth (outer) radius 212. Second substrate portions 204a-204d have a substrate arc length 213 spanning about eighty degrees. FIG. 6A is a plan view of only second substrate 204 and semiconductor layer portions 206a-206d with first substrate 202 removed for clarity. Semiconductor layer portions 206a-206d each have a third radial width 214 between a fifth (inner) radius 216 and a sixth (outer) radius 218, where the fifth radius 216 is equal to or greater than third radius 210 and sixth radius 218 is equal to or less than fourth radius 212. Portions 206a-206d of semiconductor layer 206 have a semiconducting arc length 220 equal to or less than substrate arc length 213. Accordingly, each portion 206a-206d of semiconductor layer 206 is positioned within the boundary of each portion 204a-204d of second substrate 204, respectively. It is contemplated that the substrates may be equal in size and configuration with the electrical connections recessed from the perimeters of both substrates within the thermoelectric module.

Figure 6B:
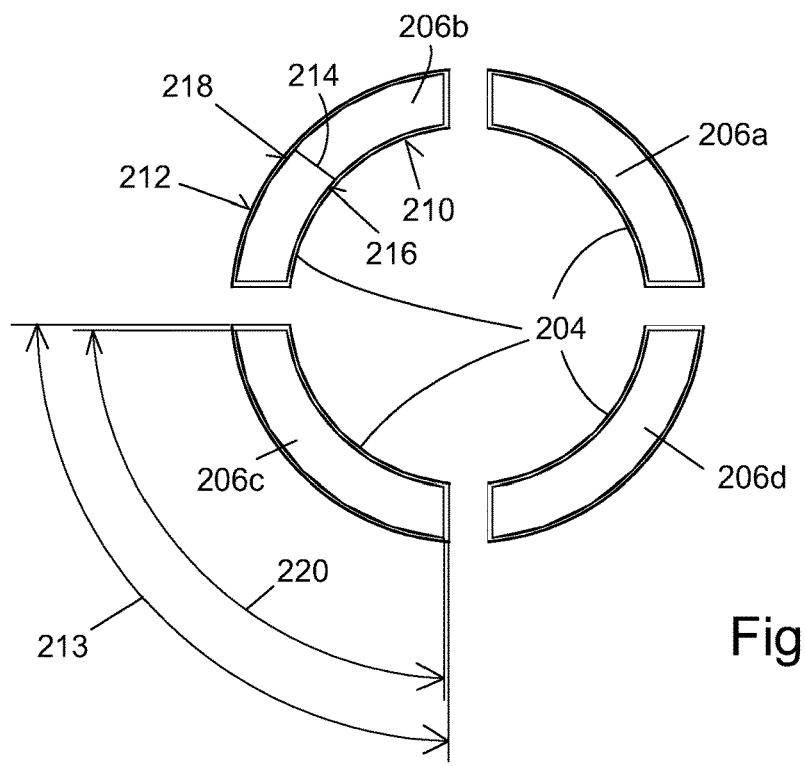
FIG. 6B is a top, plan view of the thermoelectric module of FIG. 6A with the first substrate layer removed for clarity.
Figure 6C:
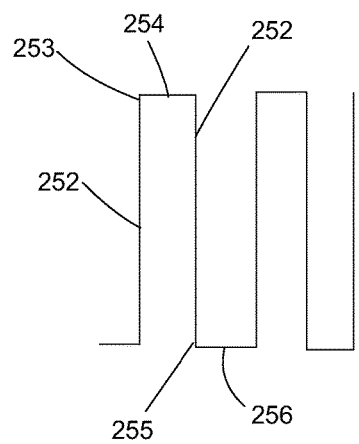
FIG. 6C is a front view of one embodiment of a heat sink.
Figure 6D:
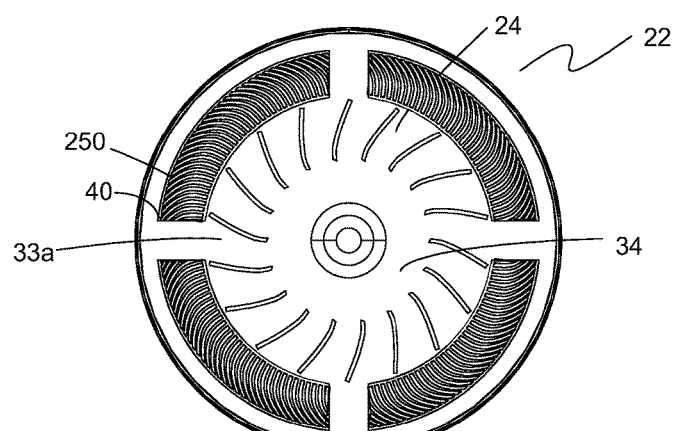
FIG. 6D is a top plan view of one embodiment of a heat sink showing forward curving heat sink fins.
Figure 6E:
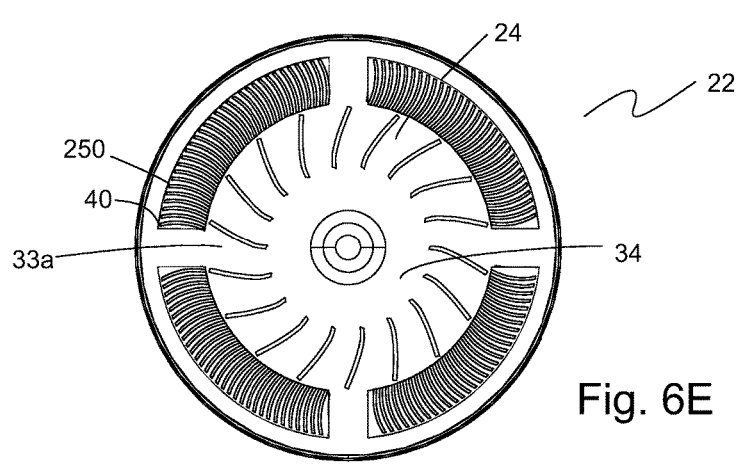
FIG. 6E is a top plan view of one embodiment of a heat sink showing radially curving heat sink fins.

As shown in FIG. 6C, for example, each heat sink portion 250a-250h of heat sink 250 in one embodiment is a folded metal strip substantially having the shape of a repeating square wave that forms each heat sink fin 251. Each heat sink fin 251 has adjacent vertical portions 252 connected to a first horizontal portion 254 at a first end 253 and a second horizontal portion 256 at a second end 255. Other forms of heat sink(s) 250 are acceptable, such as a heat sink (not shown) having a plurality of fins or protrusions extending from a base plate and made by metal injection molding or other methods known in the art. Although shown as having planar sides, heat sink 250 may also be shaped in a curved format much like an impeller. FIGS. 6D and 6E illustrate a forward-curved design and a curved radial design, respectively. In FIG. 6B, the forward-curved design means that each fin of the heat sink has an end closest (i.e. the proximal end) to the central, rotational axis on a given radial line while a distal end of the same fin is on a different radial line. In FIG. 6C, the curved radial design means that the proximal and distal ends of the same fin of the heat sink would be on the same radial line from the central, rotational axis.

Heat sink(s) 250 are adhered or connected to first substrate 202 and second substrate 204 of the thermoelectric module 200 using thermally-conductive adhesives, solder, or brazing. The method used to adhere thermoelectric module(s) 200 to head exchanger(s) 250 depends on the appropriate surface of first substrate 202 and second substrate 204. For example, a copper laminate or metalized ceramic substrate may be used with soldering or brazing. Heat sink(s) 250 or other heat transfer components may also be integrally formed with or mechanically connected to first substrate 202 and/or second substrate 204. It is also contemplated that first and second substrates 202, 204 may be directly bonded (i.e. without adhesives, solder or brazing) to heat sinks 250.

Referring now to FIG. 7, a perspective illustration shows an inside surface view of one embodiment of second impeller body 100. Like first impeller body 22, second impeller body 100 has a second inner region 112 of generally circular shape and a second outer ring 114 connected to second inner region 112 by a plurality of second bridge segments 116. Second impeller body 22 has a plurality of second openings 122, preferably with one opening 122 disposed in each of four quadrants 124a-124d, having even angular spacing between second bridge segments 116, and aligned with openings 40 of first impeller body 22. Each second opening 122 preferably extends between a seventh (inner) radius 126 and an eighth (outer) radius 128 from a center 130 of second impeller body 100. Seventh radius 126 and eighth radius 128 are preferably the same as first radius 42 and second radius 44, respectively, of first impeller body 22. Preferably, each second opening 122 has a second arc width 132 spanning about eighty degrees. Second openings 122 are sized and configured to allow heat sink(s) 250, such as 250e-h, to extend therethrough. Like first impeller body 22, more or fewer second openings 122 may be used in second impeller body 100.

Surrounding each second opening 122 is a substrate recess 134 sized to receive second substrates 204. As assembled, edges of each second substrate 204 occupy a substrate recess 134 with the attached heat sink 250 extending through second opening 122. Bridge segments 37 of first impeller body and second bridge segments 116 of second impeller body are spaced from first substrate 202 to compensate for thermal expansion of thermoelectric module 200. Recesses 134 are useful to prevent thermoelectric module 200 from rotating with respect to second impeller body 100 (and also first impeller body 22). In embodiments where second substrates 204 extend to approach but spaced from one another to compensate for thermal expansion of thermoelectric module 200 or where recesses 134 are not a structural feature of the impeller body, other structures such as clips, fasteners, or protrusions may optionally be added to prevent rotation of thermoelectric module 200 from rotating with respect to impeller assembly 20. Second impeller body 100 has a plurality of second impeller vanes 102 extending from outside surface 108 (not visible). A second hub 120 is disposed on outside surface 108, preferably at center 130 of second impeller body 100. Second outer ring 114 has a second perimeter rim 136 extending in an opposite direction (e.g., upward) from impeller vanes 102 (e.g., extending downward).

Figure 8:
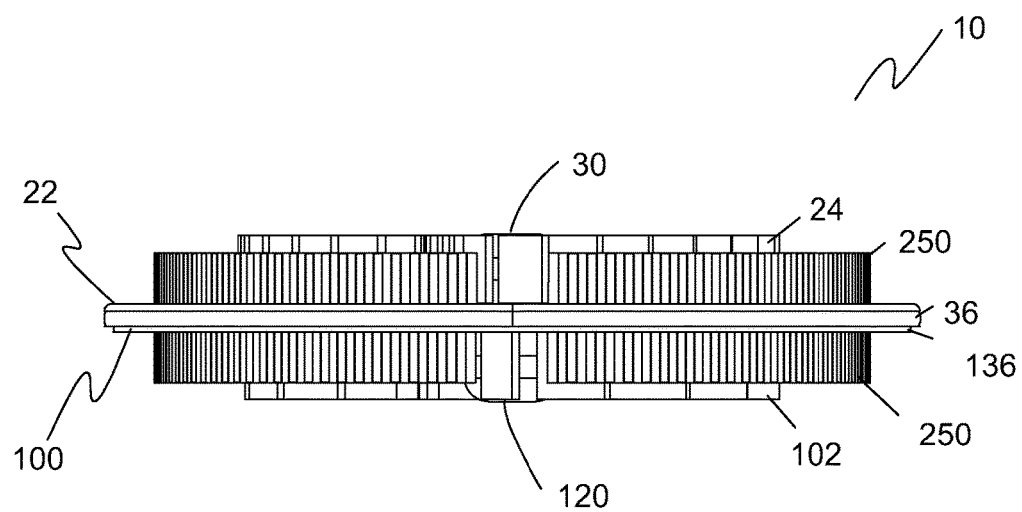
FIG. 8 is a side view of the fluid heat exchanger of FIG. 1.

Referring now to FIG. 8, a side view illustrates one embodiment of impeller assembly 20 of fluid heat exchanger 10. In one embodiment as illustrated, perimeter rim 36 of first impeller body 22 is shaped and configured to overlap, engage, and/or lock with second perimeter rim 136 of second impeller body 100 to connect first impeller body 22 to second impeller body 100. Heat sinks 250 extend through first impeller body 22 and through second impeller body 100. Although in this embodiment, first impeller vanes 24 are shown to extend from first impeller body beyond heat sink 250 and second impeller vanes 102 are shown to extend from second impeller body extend beyond heat sink 250, it has been found that airflow and quietness of operation may be optimized when first and second impeller vanes 24, 102 are equal to or less than the height of heat sinks 250. First hub 30 and second hub 120 extend transversely from the plane of first and second impeller bodies 2, 100, respectively.

Figure 9:
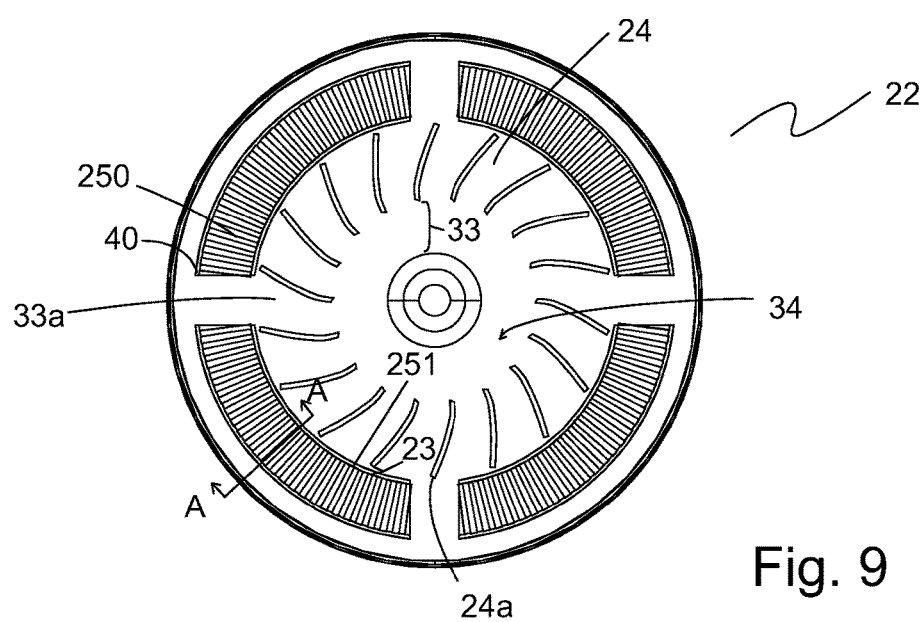
FIG. 9 is a plan view of the fluid heat exchanger of FIG. 1.

Referring now to FIG. 9, a plan view illustrates one embodiment of impeller assembly 20 as viewed from first side 12. First impeller vanes 24 extend from outside surface 34 of inner region 33 and are disposed towards a radially outward portion 33a of inner region 33, preferably proximate openings 40 and heat sinks 250. A relatively small space is desired between impeller vane outer edge 24a and heat sink inner edge 251. This small space 23 acts as a plenum to aid uniform airflow through heat sink 250.

Figure 10:
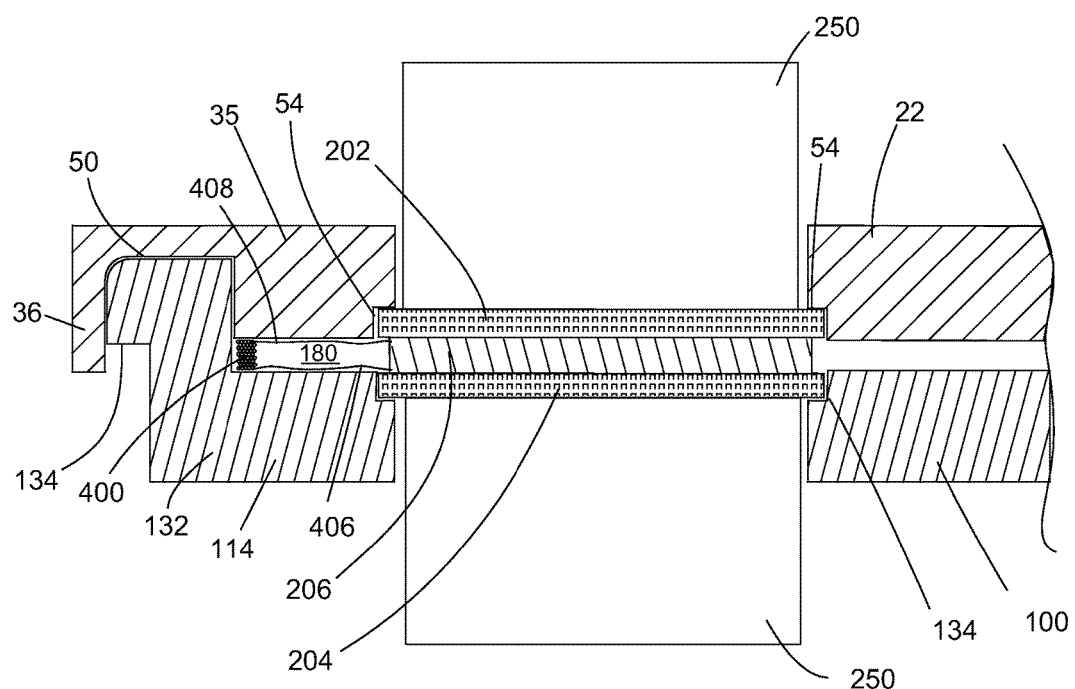
FIG. 10 is a side cross-sectional view through line A-A of FIG. 9 showing assembly of the fluid heat exchanger of FIG. 1.

Referring now to FIG. 10, a cross-sectional view taken along line A-A of FIG. 9 illustrates portions of first impeller body 22, second impeller body 100, and thermoelectric module 200 with heat sinks 250. First substrate 202 is received in first substrate recess 54 of first impeller body 22. Second substrate 204 is received in recess 134 of second impeller body 100. Semiconductor layer 206 is positioned in a gap 180 between first impeller body 22 and second impeller body 100. Perimeter rim 36 of first impeller body 22 and second perimeter rim 136 of second impeller body 100 overlap, interlock, or meet one another and are configured to define gap 180. Gap 180 preferably extends between substantial portions of first and second impeller bodies 22, 100. In one embodiment, perimeter rim 36 extends transversely (e.g., downward) from outer ring 35 of first impeller body and defines a slot or recess 50 sized to receive second perimeter rim 136. Second perimeter rim 136 extends transversely (e.g., upward) from second outer ring 114 and fits into recess 50. Optionally, first perimeter rim 36 has a catch 36a that engages second perimeter rim 136 to lock together first impeller body 22 and second impeller body 100.

The induced power is generated by induced current through current carrying conductors or wire windings 400 in gap 180 between first impeller body 22 and second impeller body 100. In one embodiment, wire windings 400 are disposed in outer ring 35 of first impeller body and or second outer ring 114 of second impeller body. Electrical connections 406, 408 are made to thermoelectric module 200 by passing conductors through gap 180 between first impeller body 22 and second impeller body 100. A magnetic field is supplied by pole pieces 402 (shown in FIG. 11), which are discussed below with reference to FIG. 11.

Figure 11:
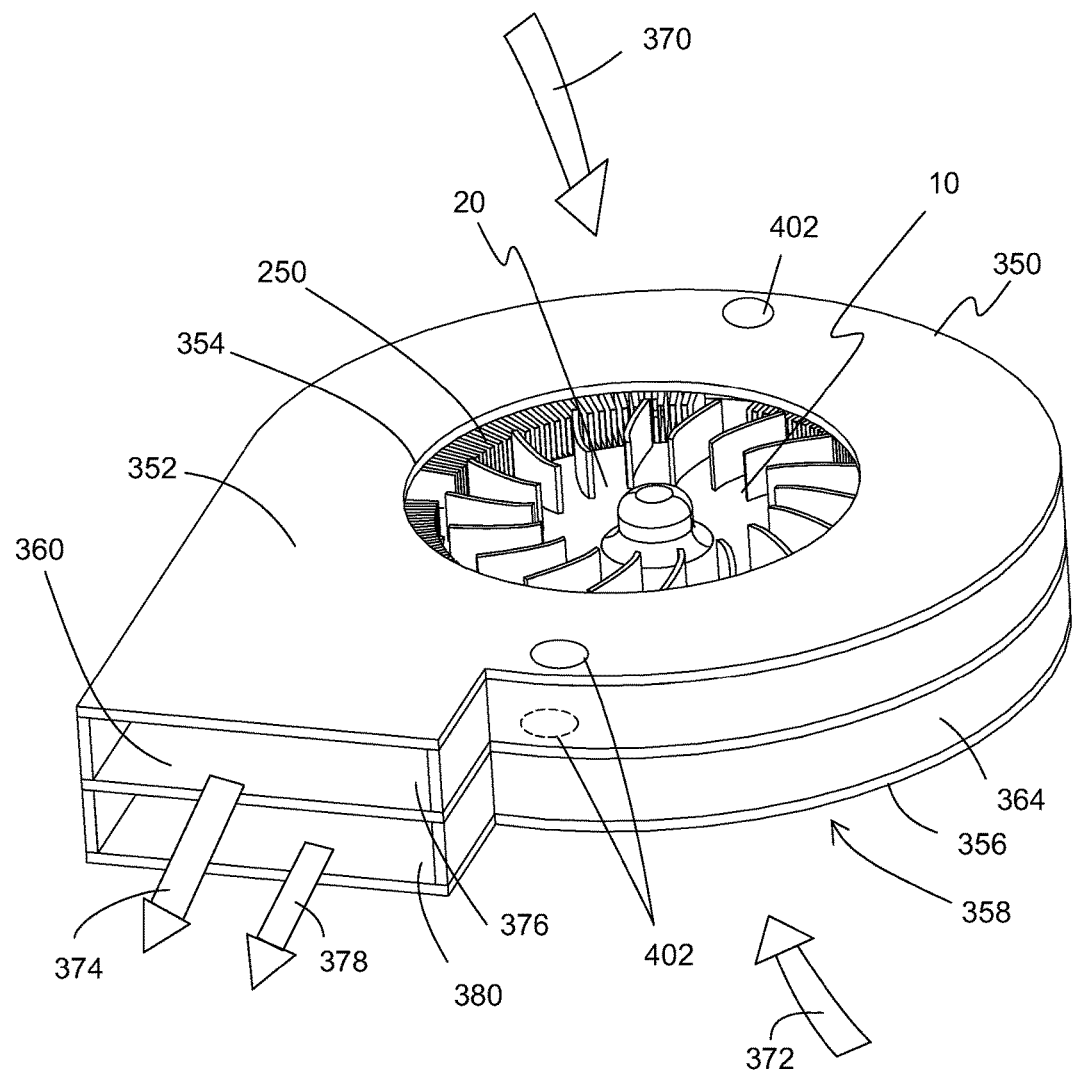
FIG. 11 is a perspective view of the fluid heat exchanger of the present invention shown within a housing.

Referring now to FIG. 11, there is illustrated fluid heat exchanger 10 that includes impeller assembly 20 disposed within a housing 350. Housing 350 has a first side panel 352 with first side panel opening 354, a second side panel 356 with second side panel opening 358 (not visible), a flow divider panel 360 with divider opening 362 (not visible), and a sidewall 364 extending between and connecting first side panel 352, second side panel 356, and flow divider panel 360. Flow divider panel 360 is preferably aligned with perimeter rim 36 (shown in FIG. 3) and second perimeter rim 136 (shown in FIG. 7) to separate first fluid stream 370 (e.g., cooled fluid) and second fluid stream 372 (e.g., warmed fluid). Preferably, divider opening 362 is sized just larger than impeller assembly 20 to minimize mixing of first fluid stream 370 and second fluid stream 372. Although the above-described induction power may be used to power the thermoelectric modules 200, it requires a much larger motor or prime mover to counter the EMF (electromagnetic force) from such a structure to drive the impeller assembly 20. A better alternative is discussed with regards to FIGS. 18-20 below.

In another embodiment (not shown), housing 350 has a first portion that includes first side panel and part of sidewall 364 and a second portion that includes second side panel 356 with a second part of sidewall 364. First portion and second portion join together along mating portions of sidewall 364 and define a slot or groove to receive flow divider panel 360. It is also contemplated that flow divider panel 360 may be molded, printed or otherwise made part of first and/or second side panel 352, 356 of housing 350.

Housing 350 is designed to allow a first fluid stream 370 to be taken in through first side panel opening 354 and a second fluid stream 372 to be taken in through second side panel opening 358. Each side of impeller assembly 20 creates a differential pressure that results in fluid moving across heat sinks 250 and flowing as a first exhaust stream 374 through first outlet 376 and as a second exhaust stream 378 through second outlet 380. Thus, fluid heat exchanger 10 is suitable for cooling sensitive electronic enclosures, computer boxes, cooler bins, refrigerator boxes, cabinets, or hermetically sealed or clean systems. Fluid heat exchanger 10 may also be used to direct a conditioned fluid source (e.g., first flow stream 370) to a load while diverting waste heat away from the load. This device is also suitable for use as an integral part of a closed loop heat exchanger system. When thermoelectric module 200 is powered, the fluid moving across the heat sinks is either heated or cooled depending on the polarity of the supplied voltage. It is also contemplated that a single housing input opening may be used in place of having first and second side panel openings 354, 358. For example, housing 350 may incorporate a single radial input opening to receive a fluid stream 370 that is then divided internally to present the fluid stream to each side of the impeller assembly. In another example, first and second impeller bodies have a plurality of openings adjacent the hub 30 that allows fluid flow from the first side panel opening 354 to not only move through or across heat sinks 250 of first impeller body 22 but also to pass through first and second impeller bodies 22, 100 to the second side 14 of impeller assembly 20 to thereby move input fluid flow across heat sinks 250 of second impeller body 100.

In another embodiment, heat sinks 250 are configured as impeller vanes 24 and/or 102 or are connected to impeller vanes 24 and/or 102 to increase heat transfer. Using heat sinks 250 as impeller vanes reduces the pressure drop and efficiency losses associated with standard thermoelectric devices with heat sinks. The result is that more fluid flows to the intended recipient. Impeller assembly 20 of the present invention introduces both a main fluid stream (e.g., first fluid stream 370) and a waste fluid stream (e.g., second fluid stream 372) into the same relatively compact, dual-sided rotating impeller. This design further increases fluid flow by providing two individual fluid streams as compared to a single fluid supply being split between a main fluid stream (e.g., cold side) and waste side fluid stream (e.g., hot side). This increased fluid flow results in greater overall heat transfer. Compared to prior art designs, the construction techniques of fluid heat exchanger 10 eliminate many of the cost and reliability issues in addition to improved performance. It is noted that designating the cold side as the main stream and the hot side as the waste stream is not limiting. Depending on the preferred application, the hot side may be the main fluid stream.

Fluid heat exchanger 10 rotates on a shaft or shafts (not shown) connected to or extending through hub 30 and second hub 120 and driven by a motor or other prime mover. A brushless motor (not shown) may optionally be used with fluid heat exchanger 10 as necessary. It is anticipated that most applications will use a separate prime mover to simplify design.

A magnetic field is provided by pole pieces 402 disposed in housing 350. Magnetic flux can be supplied from small permanent magnets or through wound pole pieces where the flux strength is controlled by a variable field excitation current. In one embodiment, pole pieces 402 are disposed on or in flow divider panel 360, which is adjacent to perimeter rim 36 and second perimeter rim 136. In one embodiment, pole pieces 402 are disposed along an edge of divider opening 362 of flow divider panel 364. Pole pieces 402 are alternately disposed in housing 350 or outside of housing 350, depending on design parameters and constraints. For example, wire windings 400 may optionally be positioned on the impeller assembly 20 above the heat sinks 250. Additionally, wire windings 400 may be positioned in multiple positions on impeller assembly 20 to provide multiple sources of induced power. Wire windings 400 in impeller assembly 20, which is coupled to thermoelectric module through a rectifier 404 (not shown), are typically placed in gap 180 between outer ring 35 and/or second outer ring 114 and in close proximity to pole pieces 402. As wire winding 400 moves through the magnetic field, a current is induced in the conductor and power is supplied to thermoelectric module 200. The amount of current applied will depend on the number of windings, rotation speed and strength of the magnetic field.

Impeller assembly 20 may be made from a variety of materials that include plastics, conductive plastics, aluminum, steel or any other material suitable for the specific application. For high volume and lower cost, the preferred material, of first impeller body 22 and second impeller body 40 is injection-molded plastic. Other applications may benefit from material substitutions depending on fluid, performance, and cost considerations.

Another embodiment of the fluid heat exchanger 10 of the present invention is discussed with reference to FIGS. 12 through 20. It has been discovered that the impeller vanes 24 and fins of heat sinks 250 can be configured, combined, or modified to achieve fluid flow conditions as required for a given application, whether it be high fluid flow with high static pressure or moderate fluid flow with low noise.

Figure 12:
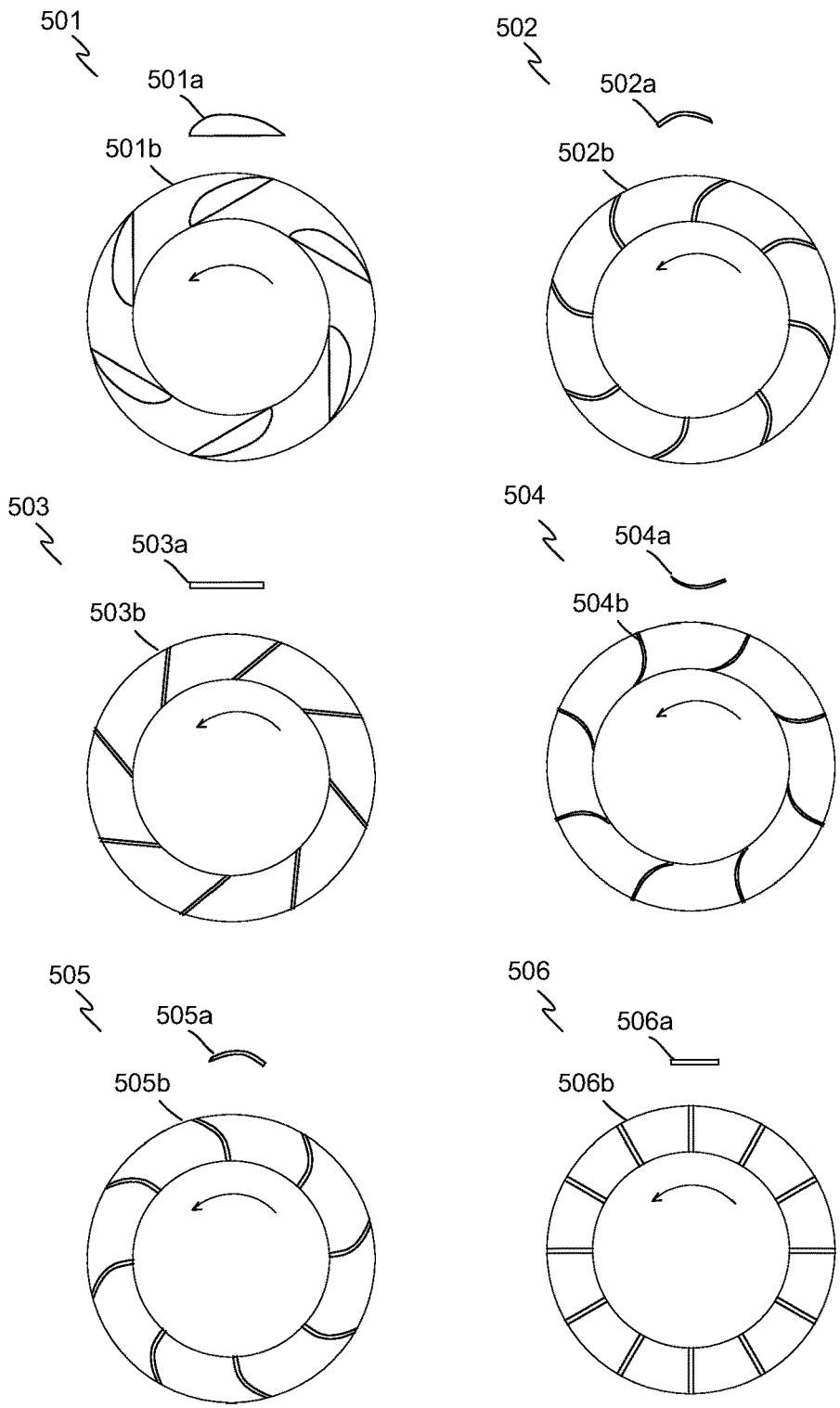
FIG. 12 is a schematic illustration of various common fan blade designs for centrifugal fans or blowers.

FIG. 12 illustrates longitudinal, cross-sectional views of common blade designs including an airfoil design 501, a backwards-curved design 502, a backward-inclined design 503, a radial-tip design 504, a forward-curved design 505, and a radial blade design 506. Fan blades 501a, 502a, 503a, 504a, 505a, 506a are shown in isolation to illustrate the profile of the blade and also shown as assembled in centrifugal fans 501b, 502b, 503b, 504b, 505b, 506b. Airfoil design 501 is the most efficient design and has relatively low noise.

For example, using impeller vanes 24 that have an efficient airfoil design combined with a folded fin heat sink having a forward-curved configuration as shown in FIG. 6B provides relatively high static pressure and volumetric flow with low noise levels. The airfoil-based impeller vanes 24 develop a moderately high airflow to the inlet portion of the folded fin heat sinks 250. Such impeller vanes 24 provide adequate fluid flow without an excessively high pressure that could cause partial bypass of the heat sinks 250. In other words, airflow bypass means that the air flow generated by impeller vanes 24 would be forced to move over heat sinks 250 instead of passing through heat sinks 250. This configuration of impeller vane 24 is also among the quietest designs for a radial blower. The forward-curved arrangement of the folded fin heat sink further develops this airflow while building static pressure.

Due to the combination of the airfoil-based impeller vanes 24 and forward-curved folded heat sinks 250, fluid heat exchanger 10 quietly delivers air or fluid to heat sinks 250 with minimal or reduced turbulence and without excessively high pressures that cause the fluid to bypass heat sinks 250. The combination also allows heat sinks 250 to amplify the fluid flow and produce elevated static pressure of the outlet fluid stream. For optimum efficiency and to avoid bypass flow over the heat sinks, one must be diligent to ensure that first stage flow development (from impeller vanes 24) does not exceed the pressure or flow rate capacity of the the second stage fluid flow (across/through heat sink 250).

Figure 13:
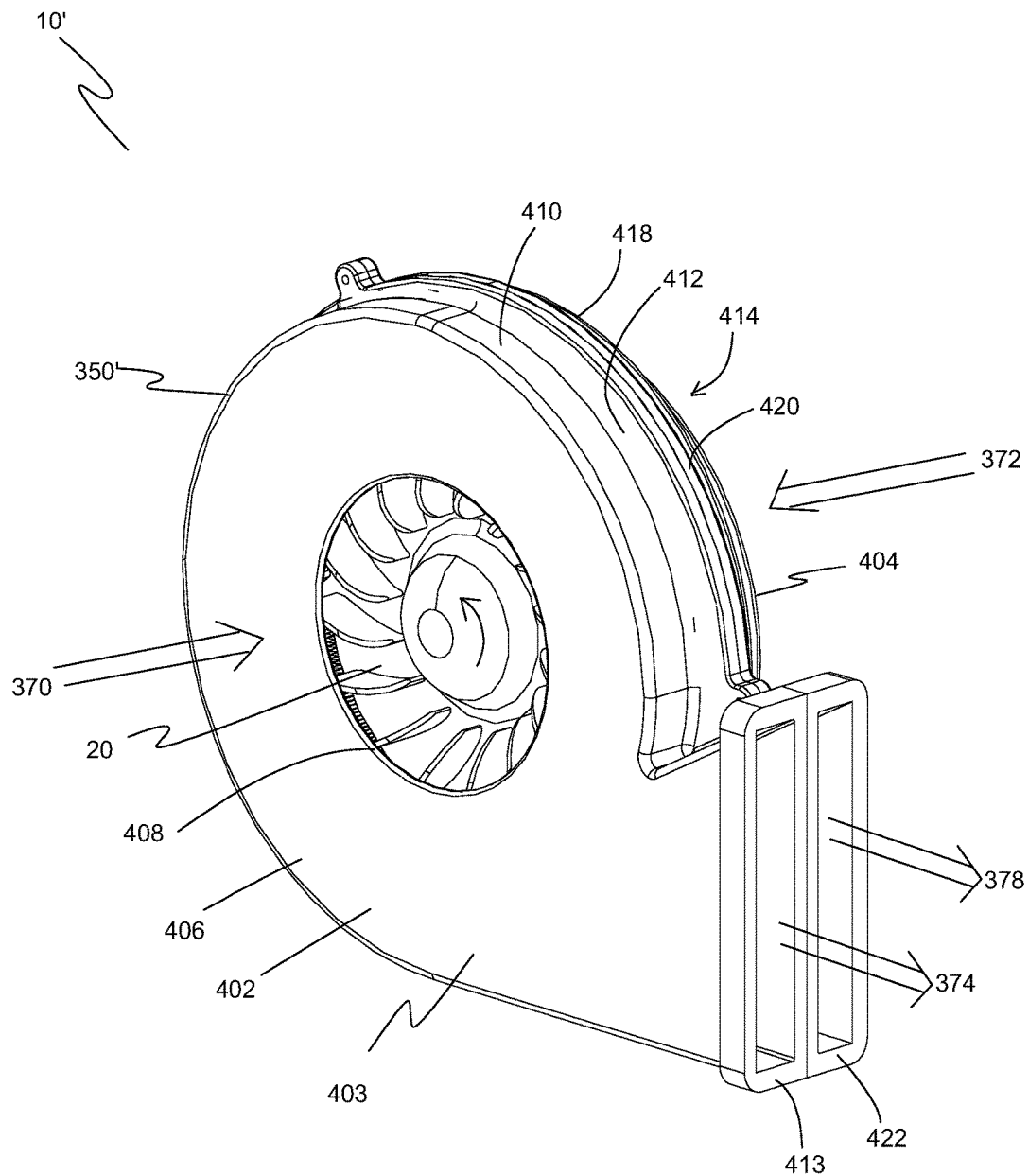
FIG. 13 is a perspective view of another embodiment of a fluid heat exchanger of the present invention.

Referring now to FIG. 13, there is illustrated another embodiment of fluid heat exchanger 10' within a housing 350'. Housing 350' has a first housing member 403 and a second housing member 404. In one embodiment, first housing member 403 has a first housing body 406 that includes a first housing input opening 408 and a first housing sidewall 410 extending transversely from first housing body 406 to a first housing flange 412. First housing member 403 also has a first housing outlet portion 413. Similarly, second housing member 404 has a second housing body 414 that includes a second housing input opening 416 (shown in FIG. 15) and a second housing sidewall 418 extending transversely from second housing body 414 to a second housing flange 420. Second housing member has a second housing outlet portion 422.

First and second housing members 402, 404 can be attached or secured to one another along first and second housing flanges 412, 420 with impeller assembly 20 retained within housing 350'. Inner and outer surfaces of first and second housing bodies 406, 414 may have a substantially planar profile, a domed profile, or other profiles as appropriate for the desired fluid flow and/or profile of impeller assembly 20. As illustrated in FIG. 13, first and second housing outlet portions 413, 422 extend together in the same direction from housing 350'; however, it is contemplated that first and second housing outlet portions 413, 422 may extend in different directions from one another. For example, cooled fluid exits first housing outlet portion 413 in one direction and heated fluid exits second housing outlet portion 422 in a direction 180° from the cooled fluid.

As with embodiments discussed above, housing 350' is designed to allow a first fluid stream 370 to be taken in through first housing input opening 408 and a second fluid stream 372 to be taken in through second housing opening 416. Each side of impeller assembly 20 creates a differential pressure that results in fluid moving across heat sinks 250 and flowing as a first exhaust stream 374 through first housing outlet portion 413 and second exhaust stream 378 flowing through second housing outlet portion 422.

Figure 14:
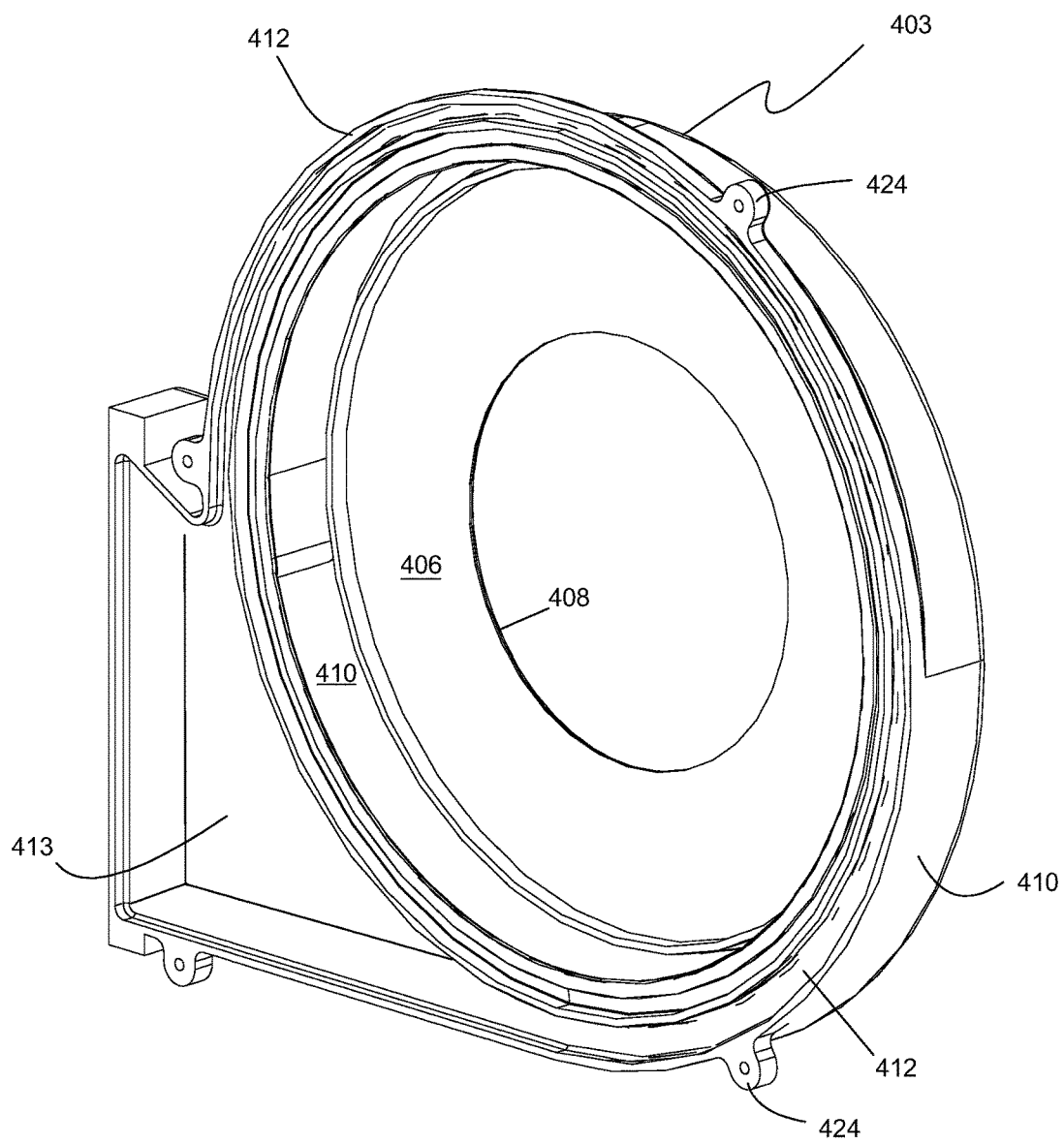
FIG. 14 is a perspective view of one embodiment of a first side housing of the present invention showing an inside surface.

Referring now to FIG. 14, a perspective view illustrates the inside surface of first housing member 403. As noted above, first housing member 403 has first housing body 406 with first housing input opening 408, first housing sidewall 410 extending to first housing flange 412, and first housing outlet portion 413. Optional flange tabs 424 are useful for connecting first housing member 403 to second housing member 404 using fasteners.

Figure 15:
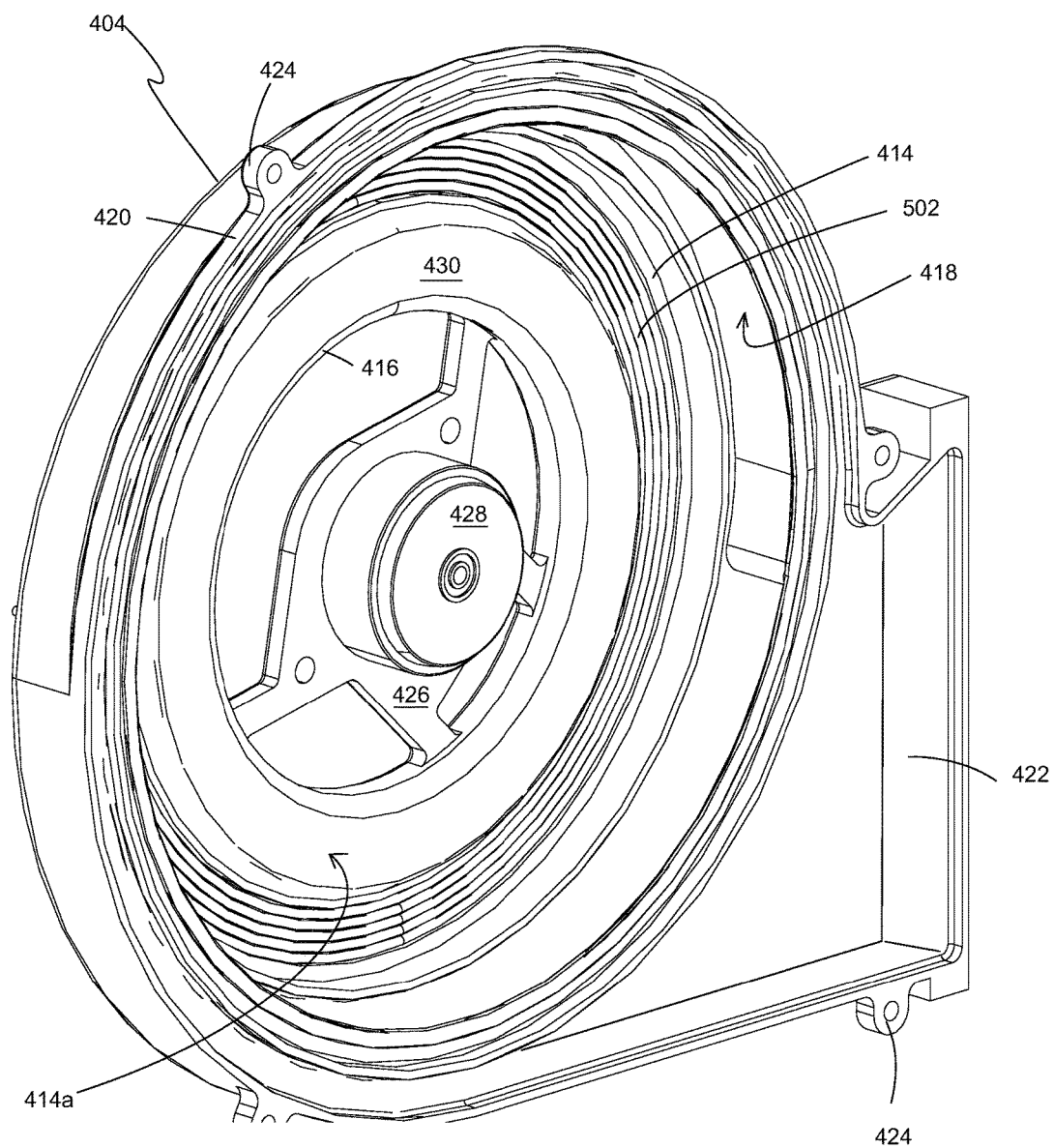
FIG. 15 is a perspective view of one embodiment of a second side housing of the present invention showing an inside surface with transmitter coil.

Referring now to FIG. 15, a perspective view illustrates the inside of second housing member 404 that includes second housing body 414 with second housing input opening 416, second housing sidewall 418, second housing flange 420, flange tabs 424, and second housing outlet portion 422. A mounting bracket 426 is connected to second housing body 414 within second housing input opening 416. Mounting bracket 426 is useful for connecting housing 350' with a motor or prime mover 428.

Second housing body 414 has a baffle ring 430 extending inwardly from an inside surface 414a of second housing body 414 and positioned to align with heat sinks 250. Baffle ring 430 reduces or prevents fluid (e.g., air) from bypassing or flowing over heat sinks 250 on first side 12 (e.g., cooling or main side) of fluid heat exchanger 10. Fluid flow that bypasses heat sinks 250 has been found to be detrimental since the ambient fluid (e.g., air) mixes with the cooled fluid flowing out of heat sinks 250, thereby reducing the temperature differential of heat exchanger 10. Baffle ring 430 acts as a shroud positioned to align with and in close proximity to heat sinks 250. Due to the reduced space between baffle ring 430 and heat sinks 250, baffle ring 430 causes fluid to flow through the fins of heat sinks 250 instead of over or around them. Baffle ring 430 has an annular shape and can be attached to or formed with second housing member 404. In one embodiment, second housing body 414 has a profile that defines baffle ring 430. In another embodiment, baffle ring 430 is a separate component that is attached to inside surface 414a of second housing body 414. Transmitter coil 502 is fixedly attached to inside surface 414a of second housing member 404 and is stationary during operation of fluid heat exchanger 10'. In one embodiment, transmitter coil 502 is positioned adjacent inside surface 414a between baffle ring 430 and sidewall 418.

Referring now to FIG. 16, there is shown another embodiment of a first impeller body 22 that includes an annular divider ring 440 as part of perimeter rim 36. Conventional sealing techniques between the main (cool) and waste (hot) sides of fluid heat exchanger 10 cause performance degradation due to fluid migration from the second side (e.g., waste/hot side) to the first side (e.g., main/cool side). In order to minimize this fluid transfer, embodiments of fluid heat exchanger 10 include divider ring 440 that extends about the circumference of impeller assembly 20 between first side 12 (e.g., cool side) and second side 14 (e.g., hot side). Divider ring 440 has a cross-sectional T-shape with an annular portion 444 and a radial portion 446 as also shown, for example, in FIG. 16A. Divider ring opening 448 may optional have a cross-sectional shape that is also T-shaped. Divider ring 440 rotates within a corresponding divider ring opening 448 defined by first and/or second housing members 402, 404. When both divider ring 440 and divider ring opening 448 have cross-sectional T-shapes, the combination thereby defines a circuitous fluid flow path with multiple direction changes and minimized clearance between divider ring 440 and first and second housing members 402, 404. As a result, divider ring 440 creates a large drop in static pressure and minimizes fluid flow between first side 12 and second side 14 of impeller assembly 20. Also shown is a plurality of air flow shields 22a that prevents airflow from moving across bridge elements 37 in between adjacent heat sinks 250

FIG. 16A shows a cross-sectional view of a portion of first impeller body 22 with bridge section 37 extending to perimeter rim 36 having divider ring 440. As discussed above, perimeter rim 36 in this embodiment includes radial portion 446 extending radially and connecting to annular portion 444. Thus, perimeter rim 36 defines an annular dividing ring 440 having a cross-sectional T shape. Dividing ring 440 and corresponding divider ring opening 448 can have other shapes, such as a Y shape, a wedge shape, or other cross-sectional shapes. For best performance, however, cross sectional shape of perimeter rim 36 and that of corresponding recess 448 restrict, minimize, or substantially prevent fluid flow between first side 12 and second side 14.

Referring now to FIG. 17, a cross-sectional view shows first impeller body 22, first housing member 403, and second housing member 404. Near the upper and lower portions of FIG. 17, T-shaped divider ring 440 is shown extending into a corresponding divider ring opening 448 defined by first housing member 403 and second housing member 404. Also illustrated and more clearly shown in this Figure are annular ridges 402a and 404a that extend away from inside surfaces 402b, 404b, respectively, a predefined distance towards impeller assembly 20 (impeller assembly in second housing member 404 not shown for clarity reasons) sufficient to prevent airflow from impeller vanes 24, 102 from by-passing heat sinks 250. It was found that extending annular ridge 402a beyond the top surfaces 254a of heat sinks 250 effectively minimizes or eliminates any by-passing airflow described. With respect to annular ridge 404a, it is contemplated that any by-pass airflow has minimal effect as this represents the "waste" side of thermoelectric module 200 and may even have beneficial advantage in possibly cooling the resonant magnetic induction circuit situated therein (if required) and discussed below. Another advantage of annular ridges 402a, 404a is that they add some stiffness to first side panel 352 and second side panel 356 of housing 350.

Figure 18:
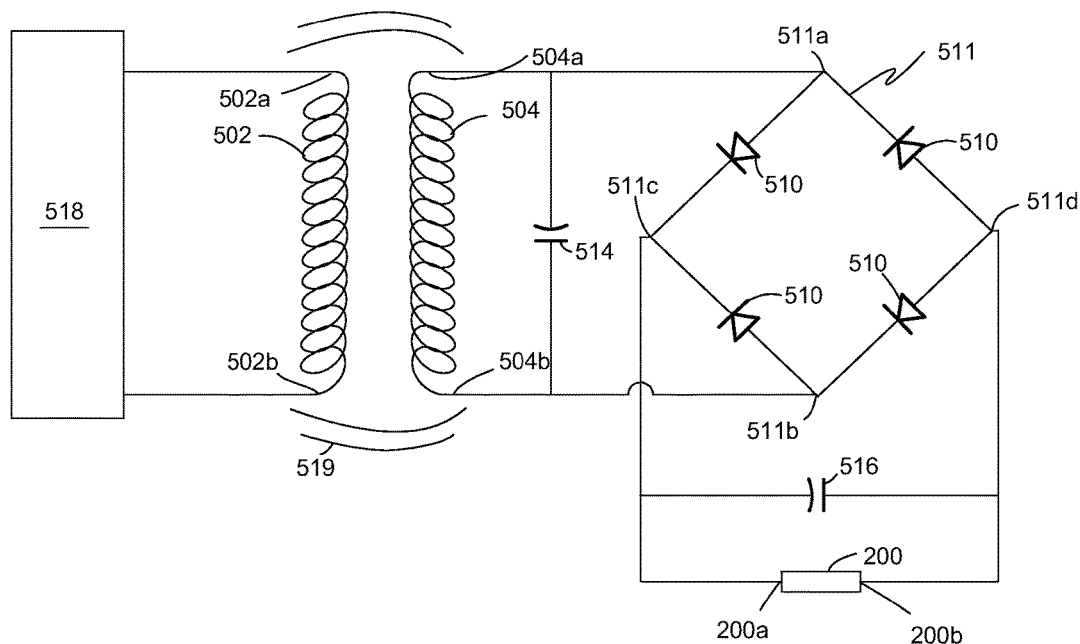
FIG. 18 is a wiring schematic for one embodiment of an induced power assembly of the present invention.
Figure 19:
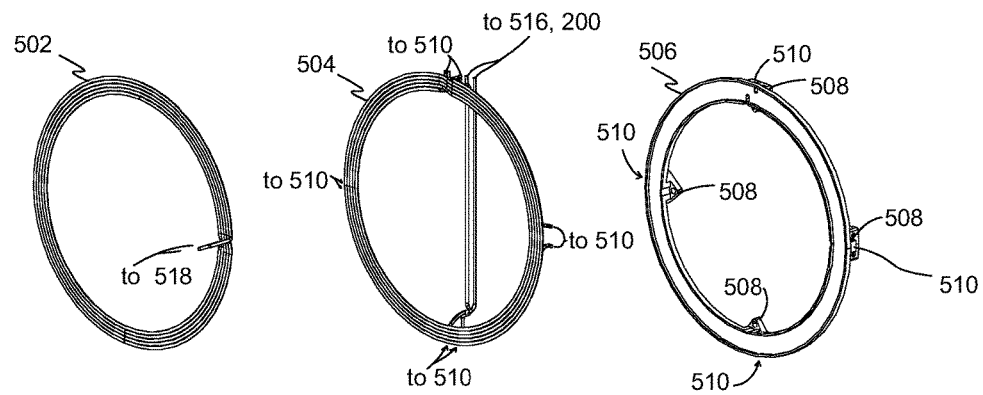
FIG. 19 is an exploded, perspective view of components of one embodiment of an induced power assembly of the present invention.

Referring now to FIG. 18, one embodiment of an inductive power assembly 500 is illustrated schematically and is called resonant magnetic induction. Inductive power assembly 500 includes oscillator circuit 518, transmitter coil 502, receiver coil 504, tuning capacitor 514, thermoelectric module(s) 200, and a rectifier circuit 511 with diodes 510 and filter capacitor 516. Transmitter coil 502 has a transmitter coil first end 502a and a transmitter coil second end 502b electrically coupled to the oscillator circuit 518. Receiver coil 504 is spaced from transmitter coil 502 and has a receiver coil first end 504a electrically coupled to a first rectifier circuit input 511a and a receiver coil second end 504b electrically coupled to a second rectifier circuit input 511b. Tuning capacitor 514 is electrically coupled between receiver coil first end 504a and receiver coil second end 504b. Thermoelectric module 200 has a first module input 200a electrically coupled to a third rectifier circuit input 511c and a second module input 200b electrically coupled to a fourth rectifier circuit input 511d. Filter capacitor 516 is electrically coupled between first and second module inputs 200a, 200b. Transmitter coil 502, receiver coil 504, coil tray 506, diodes 510, and respective connections are illustrated in an exploded, perspective view in FIG. 19. Coil tray 506 has a diode heat shield 508 that extends transversely to the plane of coil tray 506 where diodes 510 electrically coupled to receiver coil 504 are received on the outward facing side of diode heat shield 508. Oscillator circuit 518 is a remote power supply that supplies high frequency AC power to transmitter coil 502, thereby generating a magnetic field 519. In one embodiment, oscillator supply 518 is a Royer or Collpits oscillator circuit or other suitable triggering or control circuits. When receiver coil 504 is placed within proximity of magnetic field 519, magnetic field 519 induces an alternating current in receiver coil 504. A rectifier circuit 511, such as a full-wave bridge rectifier, converts the alternating current in receiver coil 504 to direct current. This DC current powers thermoelectric module(s) 200. Filter capacitor 516 connected in parallel with thermoelectric module(s) 200 reduces fluctuations in the DC current output from rectifier circuit 511. An optional tuning capacitor 514 is used to set the resonant frequency and voltage/current relationship to thermoelectric module 200.

Figure 20:
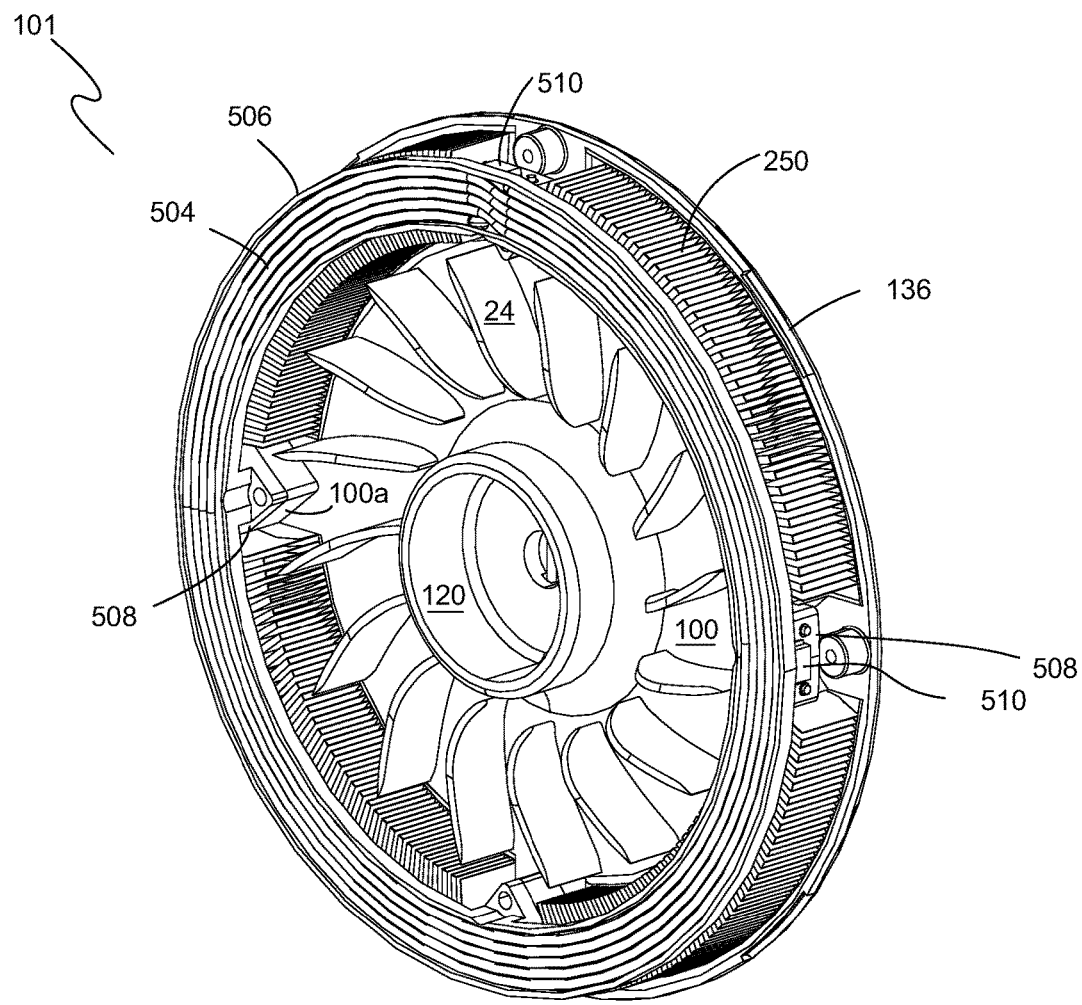
FIG. 20 is a perspective view of one embodiment of a second-side impeller assembly of the present invention showing a receiver coil radially aligned with the heat sinks in a radially-outward position on the impeller body.

Referring now to FIG. 20, a rear perspective view shows one embodiment of a second-side impeller assembly 101 with second impeller body 100 (e.g., waste side impeller) and components of inductive power assembly 500 used for resonant magnetic induction. In one embodiment, receiver coil 504 is received in an optional coil tray 506 that is attached to second impeller body 100. In other embodiments, coil tray 506 is omitted from inductive power assembly 500. In one embodiment, coil tray 506 is fixedly attached to second impeller body 100 such that diode heat shield 508 is connected to air flow shield 100a on second impeller body 100. Each of first impeller body 22 and second impeller body 100 has a plurality of air flow shields 22a and 100a, respectively, that prevents airflow from moving across bridge elements 37 in between adjacent heat sinks 250 on the respective first and second impeller bodies 22, 100.

Transmitter coil 502 for the system is located in second housing member 404 (i.e., waste side housing) and spaced mere millimeters from receiver coil 504 located on rotating second-side impeller assembly 101. The relative position of transmitter coil 502 and receiver coil 504 is tied to coil size and frequency and is important to inductive coupling and efficiency of power generation. With receiver coil 504 positioned adjacent components on second impeller body 100, it was discovered that receiver coil 504 reduced overall performance by significantly heating second exhaust stream 378 and other components. A significant improvement in this undesirable heat transfer is achieved by moving receiver coil 504 to a radially-outward portion of second impeller body 100, such as adjacent second perimeter rim 136 and/or radially aligned with heat sinks 250. In this radially-outward position, receiver coil 504 does not effectively transfer heat to second impeller blades 102 and therefore does not degrade performance of fluid heat exchanger 10'. A small air gap between the heat sinks 250 and receiver coil 504 (and/or coil tray 506 when present) prevents or reduces heat transfer from receiver coil 504 to heat sink 250 and also allows cooling fluid (e.g., air) to flow across receiver coil 504 to dissipate heat therefrom.

It was also determined that heat from capacitors 510 located in or adjacent centrally-located second hub 120 similarly degraded performance of fluid heat exchanger 10' due to heat transfer to other components. To reduce this degradation in performance, capacitors 510 are located in a radially-outward position on second-side impeller assembly 101 such diode heat shield 508 is connected to air flow shield 100a located proximate second perimeter rim 136. In this radially-outward position on or near the circumference of second impeller body 100, heat from capacitors 510 is transferred to and dissipated by second exhaust stream 378 (e.g., waste airstream). Therefore, heat from capacitors 510 does not significantly affect the overall cooling performance of fluid heat exchanger 10'.

It is contemplated that the configuration of and the number of impeller vanes and/or exchanger fins depends on the desired use of fluid heat exchanger 10'. If fluid heat exchanger 10' is configured to have the same number of impeller vanes on both sides of the impeller bodies, then the impeller vanes would push the same amount of air through both sides depending on downstream configuration. However, if one wants to cool the fluid of first exhaust stream 374 as much as possible and flow volume is not an issue, then fewer vanes would be placed on first side 12 (e.g., cold side) of fluid heat exchanger 10'. Second side 14 (e.g., hot side) would receive more airflow than the first side 12 (e.g., cooling side). The more second side 14 (e.g., hot side) is cooled, the lower the temperature that can be achieved on first side 12 (e.g., cold side). Reducing fluid flow across first side 12 (e.g., cold side) allows more time for heat transfer to first exhaust stream 374, resulting in a lower fluid temperature of first exhaust stream 374.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:
1. A method of fluid heat exchange comprising:
   providing a fluid heat exchanger comprising:
      an impeller assembly comprising:
         a first impeller body with a circular shape and having at least a first opening therethrough;
         a second impeller body disposed parallel to and connected to the first impeller body, the second impeller body having a circular shape and at least a second opening therethrough that coincides with the at least first opening of the first impeller body;
a plurality of impeller vanes extending axially from the first impeller body and away from the second impeller body;
a plurality of second impeller vanes extending axially from the second impeller body and away from the first impeller body;
at least one thermoelectric module disposed between the first impeller body and the second impeller body, the at least one thermoelectric module having a first substrate and a second substrate;
a first heat sink connected to the first substrate and extending through the at least first opening;
a second heat sink connected to the second substrate and extending through the at least second opening;
a housing having a first housing input opening, a second housing input opening, a first housing outlet portion and a second housing outlet portion, wherein the impeller assembly is rotatably disposed within the housing;
a transmitter coil disposed in the housing; and
a receiver coil disposed on the impeller assembly and spaced apart from and aligned with the transmitter coil;
rotating the impeller assembly about a central impeller axis, thereby drawing a fluid into each of the first housing input opening and the second housing input opening and dispensing fluid through each of the first housing outlet portion and the second housing outlet portion, respectively;
delivering high-frequency AC power to the transmitter coil, thereby inducing AC current in the receiver coil;
converting the induced AC current to DC power; and
delivering the DC power to the at least one thermoelectric module.

2. The method of claim 1, wherein the step of converting the induced current to DC power includes selecting a rectifier circuit having a filter capacitor electrically coupled to a bridge rectifier and in parallel with the at least one thermoelectric module.

3. The method of claim 1, wherein the step of delivering high-frequency AC power to the transmitter coil is performed using an oscillator circuit electrically coupled to the transmitter coil.

4. The method of claim 3, further comprising selecting the oscillator circuit that is one of a Royer oscillator or a Collpits oscillator.

5. The method of claim 1, wherein the step of delivering high frequency AC power to the transmitter includes using a tuning capacitor electrically coupled to the receiver coil and in parallel with a rectifier circuit.

6. The method of claim 1, wherein the step of providing the impeller assembly includes:
selecting an impeller assembly having impeller blades with an airfoil design; and
selecting a heat sink from the group consisting of a heat sink having a plurality of heat sink fins with a forward-curved design and a heat sink having a plurality of heat sink fins with a radially curved design.

7. The method of claim 1, wherein the step of providing a fluid heat exchanger includes selecting the fluid heat exchanger having the transmitter coil spaced apart from the receiver coil a distance on the order of millimeters.

8. The method of claim 1, wherein the step of providing a fluid heat exchanger includes selecting a receiver coil disposed proximate a perimeter rim of the impeller assembly.

9. The method of claim 1, wherein the step of providing a fluid heat exchanger includes selecting the impeller assembly having a plurality of diodes substantially distributed circumferentially about the impeller assembly, wherein the plurality of diodes comprise a bridge rectifier.

* * * * *